United States Patent
Hayashi

(10) Patent No.: US 11,205,655 B2
(45) Date of Patent: Dec. 21, 2021

(54) METHOD FOR MANUFACTURING SEMICONDUCTOR DEVICE INCLUDING FIN-STRUCTURED TRANSISTOR

(71) Applicant: RENESAS ELECTRONICS CORPORATION, Tokyo (JP)

(72) Inventor: Tomohiro Hayashi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 70 days.

(21) Appl. No.: 16/585,802

(22) Filed: Sep. 27, 2019

(65) Prior Publication Data

US 2020/0152652 A1 May 14, 2020

(30) Foreign Application Priority Data

Nov. 8, 2018 (JP) .............................. JP2018-210611

(51) Int. Cl.
*H01L 27/11568* (2017.01)
*H01L 29/06* (2006.01)
(Continued)

(52) U.S. Cl.
CPC .. *H01L 27/11568* (2013.01); *H01L 21/76224* (2013.01); *H01L 21/76229* (2013.01); *H01L 21/8239* (2013.01); *H01L 21/823431* (2013.01); *H01L 21/823481* (2013.01); *H01L 27/0886* (2013.01); *H01L 27/11521* (2013.01); *H01L 29/0649* (2013.01); *H01L 29/40114* (2019.08); *H01L 29/40117* (2019.08); *H01L 29/4236* (2013.01); *H01L 29/66795* (2013.01); *H01L 29/66825* (2013.01); *H01L 29/66833* (2013.01);
(Continued)

(58) Field of Classification Search
CPC ......... H01L 21/76224; H01L 21/76229; H01L 21/823431; H01L 21/823481; H01L 21/8239; H01L 27/0886; H01L 27/11521; H01L 27/11548; H01L 27/11568; H01L 27/11575; H01L 29/0649; H01L 29/40114; H01L 29/40117; H01L 29/66795; H01L 29/66825; H01L 29/66833; H01L 29/785; H01L 29/7851; H01L 29/7856; H01L 29/7881; H01L 29/792

See application file for complete search history.

(56) References Cited

U.S. PATENT DOCUMENTS 7,504,689 B2   3/2009  Hisamoto et al.
7,812,375 B2 * 10/2010  Lee ................... H01L 27/11568
                                                          257/208

(Continued)

FOREIGN PATENT DOCUMENTS

JP           2006-041354 A      2/2006

*Primary Examiner* — Joseph C. Nicely
(74) *Attorney, Agent, or Firm* — McDermott Will & Emery LLP

(57) ABSTRACT

A method for manufacturing a semiconductor device includes a step of reducing a thickness of a silicon oxide film embedded in an element isolation trench including fins in order to form protruded fins. In the step, the silicon oxide film is etched while covering part of an upper surface of the silicon oxide film with a resist pattern. At this time, the resist pattern is formed such that a distance between the fin and the resist pattern is equal to or less than a predetermined interval which is an arrangement interval of the plurality of fins.

11 Claims, 44 Drawing Sheets

(51) Int. Cl.
  *H01L 27/11521*    (2017.01)
  *H01L 29/423*     (2006.01)
  *H01L 21/28*      (2006.01)
  *H01L 27/088*     (2006.01)
  *H01L 21/8234*     (2006.01)
  *H01L 29/78*      (2006.01)
  *H01L 29/66*      (2006.01)
  *H01L 21/762*      (2006.01)
  *H01L 21/8239*     (2006.01)
  *H01L 29/792*     (2006.01)

(52) U.S. Cl.
  CPC ........ *H01L 29/7851* (2013.01); *H01L 29/792* (2013.01)

(56) References Cited

U.S. PATENT DOCUMENTS

| | | | |
|---|---|---|---|
| 7,915,691 B2* | 3/2011 | Wong | H01L 27/1104 |
| | | | 257/392 |
| 8,691,651 B2* | 4/2014 | Dai | H01L 27/1211 |
| | | | 438/275 |
| 9,337,318 B2* | 5/2016 | Liu | H01L 21/823821 |
| 10,312,327 B2* | 6/2019 | Chang | H01L 29/1083 |
| 10,867,999 B2* | 12/2020 | Wang | H01L 21/823437 |
| 2018/0097008 A1* | 4/2018 | Hayashi | H01L 21/823431 |
| 2018/0342602 A1* | 11/2018 | Tang | H01L 27/11521 |

* cited by examiner

FIG. 30

| APPLIED VOLTAGE OPERATION | Vd | Vcg | Vmg | Vs | Vb |
|---|---|---|---|---|---|
| WRITE | Vcc | 0.5V | 10V | 5V | 0V |
| ERASE | 0V | 0V | -5V | 5V | 0V |
| READ | Vcc | Vcc | 0V | 0V | 0V |

Vcc = 1.5V

METHOD FOR MANUFACTURING SEMICONDUCTOR DEVICE INCLUDING FIN-STRUCTURED TRANSISTOR

CROSS-REFERENCE TO RELATED APPLICATIONS

The disclosure of Japanese Patent Application No. 2018-210611 filed on Nov. 8, 2018 including the specification, drawings and abstract is incorporated herein by reference in its entirety.

BACKGROUND

The present invention relates to a semiconductor device and a manufacturing technique thereof, and, for example, the present invention relates to a semiconductor device including a fin-structured transistor and a technique useful for the manufacturing technique thereof.

Japanese unexamined Patent Application publication No. 2006/41354 describes a technique relating to a fin-structured nonvolatile memory cell using an upper surface and side surfaces of fin as a channel.

SUMMARY

In the fin-structured transistor, since fins protruding from the semiconductor substrate are formed, a step portion caused by the fins is generated. Then, for example, when a film is formed and patterned to cover the step portion, the thickness of the film becomes thick in the step portion, so that an etching residue tends to be generated when the film is patterned. The etching residue may cause a short circuit defect, and may peel off to become a foreign substance. Therefore, from the viewpoint of improving the reliability of the semiconductor device and the viewpoint of improving the manufacturing yield of the semiconductor device, there is a need for a device for suppressing the generation of the etching residue caused by the step portion.

Other objects and novel features will be apparent from the description of this specification and the accompanying drawings.

A method for manufacturing a semiconductor device according to embodiments includes reducing a thickness of an insulating film embedded in an element isolation trench including fins to form protruding fins. In the step, the insulating film is etched while a part of an upper surface of the insulating film is covered with a pattern. At this time, the pattern is formed such that a distance between the fin and the pattern is equal to or less than a predetermined interval, which is an arrangement interval of the plurality of fins.

According to embodiments, the reliability of the semiconductor device can be improved.

BRIEF DESCRIPTION OF THE DRAWINGS

FIG. 30 is a table showing an example of application conditions of voltages to respective portions of a selected memory cell at the time of "write", "erase" and "read".

DETAILED DESCRIPTION

Figure 1:
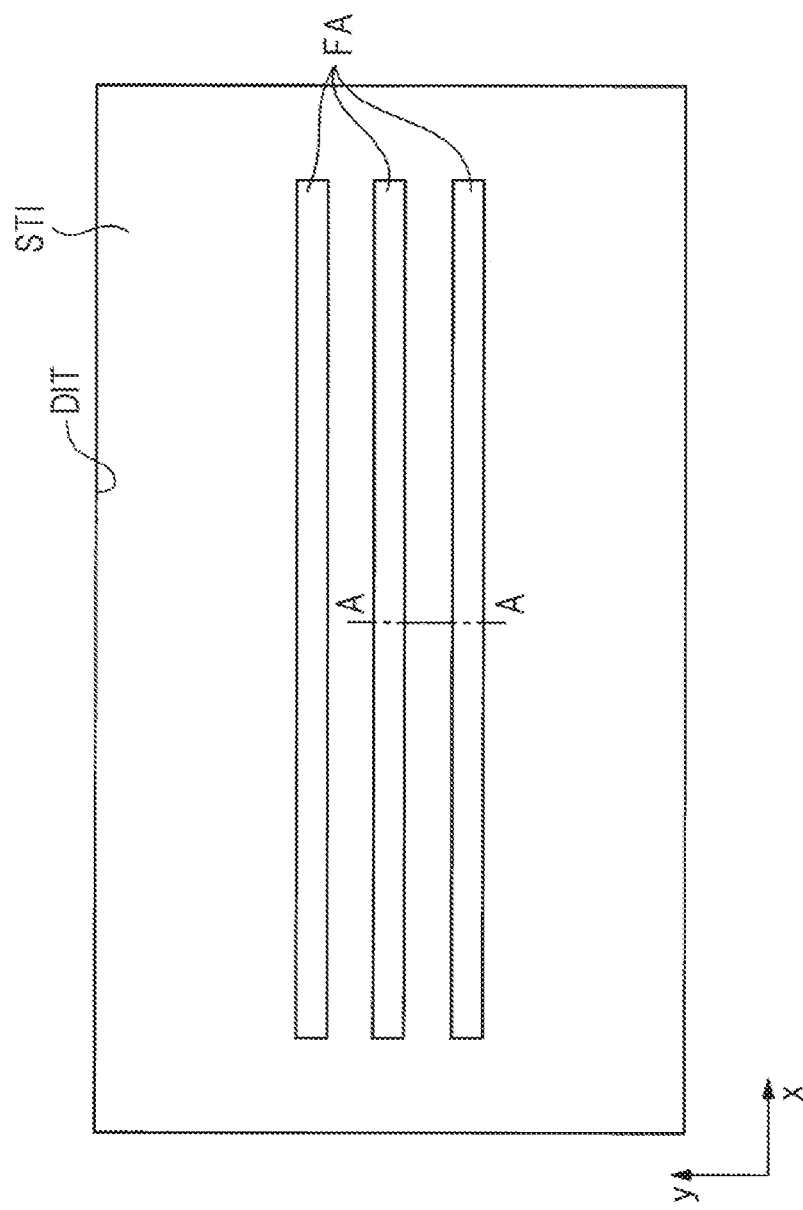
FIG. 1 is a diagram schematically showing a fin-structure of a semiconductor device in a related art.

In the following embodiments, when required for convenience, the description will be made by dividing into a plurality of sections or embodiments, but except when specifically stated, they are not independent of each other, and one is related to the modification, detail, supplementary description, or the like of part or all of the other.

In the following embodiments, the number of materials, etc. (including the number of elements, numerical values, quantities, ranges, etc.) is not limited to the specific number, but may be not less than or equal to the specific number, except for cases where the number is specifically indicated and is clearly limited to the specific number in principle.

Furthermore, in the following embodiments, it is needless to say that the constituent elements (including element steps and the like) are not necessarily essential except in the case where they are specifically specified and the case where they are considered to be obviously essential in principle.

Similarly, in the following embodiments, when referring to the shapes of the like of components, positional relationships and the like, it is assumed that the shapes and the like are substantially approximate to or similar to the shapes and the like, except for the case in which they are specifically specified and the case in which they are considered to be obvious in principle, and the like. The same applies to the above numerical values and ranges.

In all the drawings for explaining the embodiments, the same members are denoted by the same reference numerals in principle, and repetitive descriptions thereof are omitted. Note that even plan view may be hatched for the sake of clarity.

First Embodiment

For example, in a field effect transistor used in an integrated circuit or the like, from the viewpoint of improvement in performance and reduction in manufacturing cost, miniaturization of dimensions has been promoted in accordance with a scaling law. However, as the size of the field effect transistor has been reduced, it has become difficult to develop an exposure technique used for processing the field effect transistor, and the cost of a semiconductor manufacturing apparatus (processing apparatus) used for processing the field effect transistor has become very expensive.

Therefore, in recent years, field effect transistors of the "fin-structure", in which not only an active surface is used as a channel but also an active side surface is used as a channel, have begun to be adopted in order to simultaneously improve the performance of the field effect transistor and reduce the manufacturing cost. That is, in the field effect transistor of the "fin-structure", since a fin protruding from an element isolation region is formed on a semiconductor substrate and an upper surface of the fin and side surfaces of the fin are used as channels, the performance of the field effect transistor can be improved without resorting to miniaturization.

Hereinafter, first, the room for improvement inherent in the manufacturing process of the fin in the field effect transistor of the "fin-structure" will be described, and thereafter, the technical idea in the first embodiment devised for this room for improvement will be described.

Consideration of Improvement

FIG. 1 is a diagram schematically showing a fin-structure of a semiconductor device in the related art.

Here, the "related art" referred to in this specification is a technology having a problem newly found by the inventor, and is not a known prior art, but is a technology described with the intention of a prerequisite technology (unknown technology) of a new technical idea.

As shown in FIG. 1, in plan view, a plurality of fins FA are formed so as to be surrounded by an element isolation region STI embedded in an element isolation trench DIT. The plurality of fins FA extend in a X direction orthogonal to a Y direction and are arranged at predetermined intervals in the Y direction, for example.

Hereinafter, the manufacturing process of the fins will be described using the cross-sectional view along the line A-A shown in FIG. 1.

Figure 2:
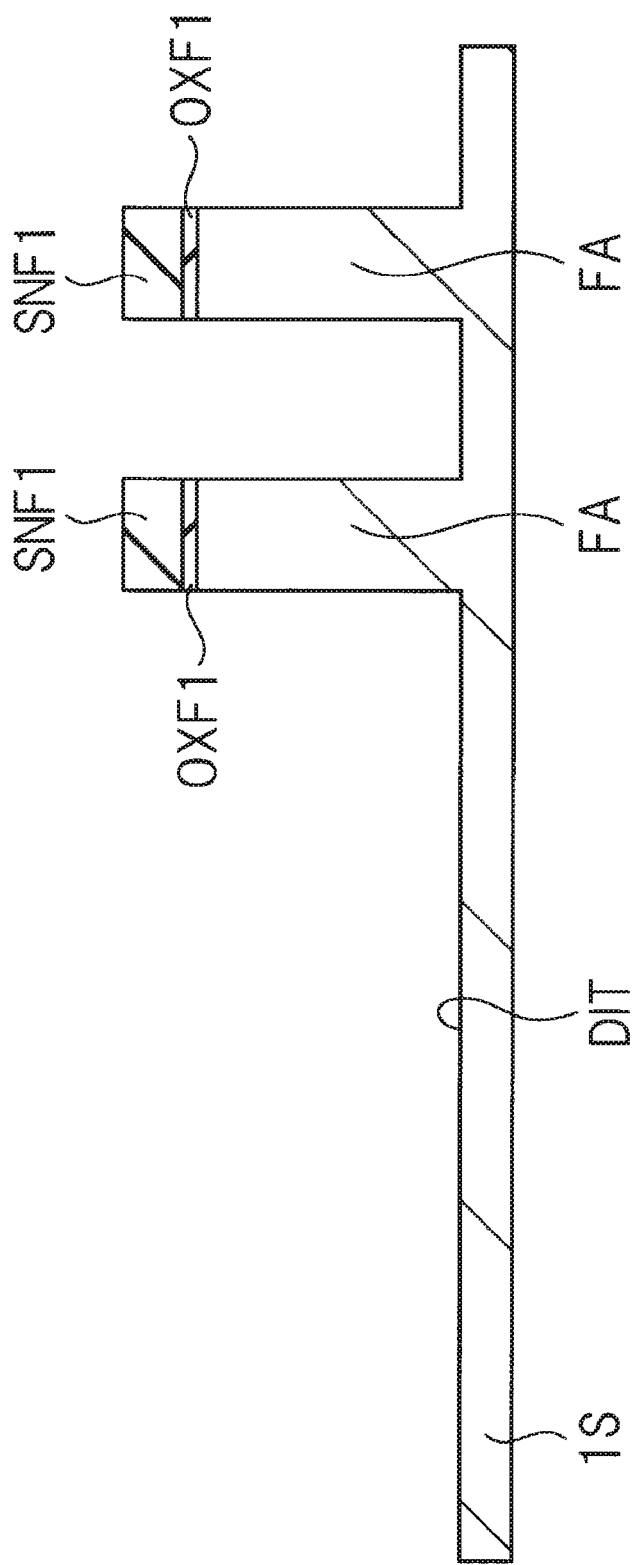
FIG. 2 is a cross-sectional view showing a manufacturing process of the semiconductor device in the related art.
Figure 3:
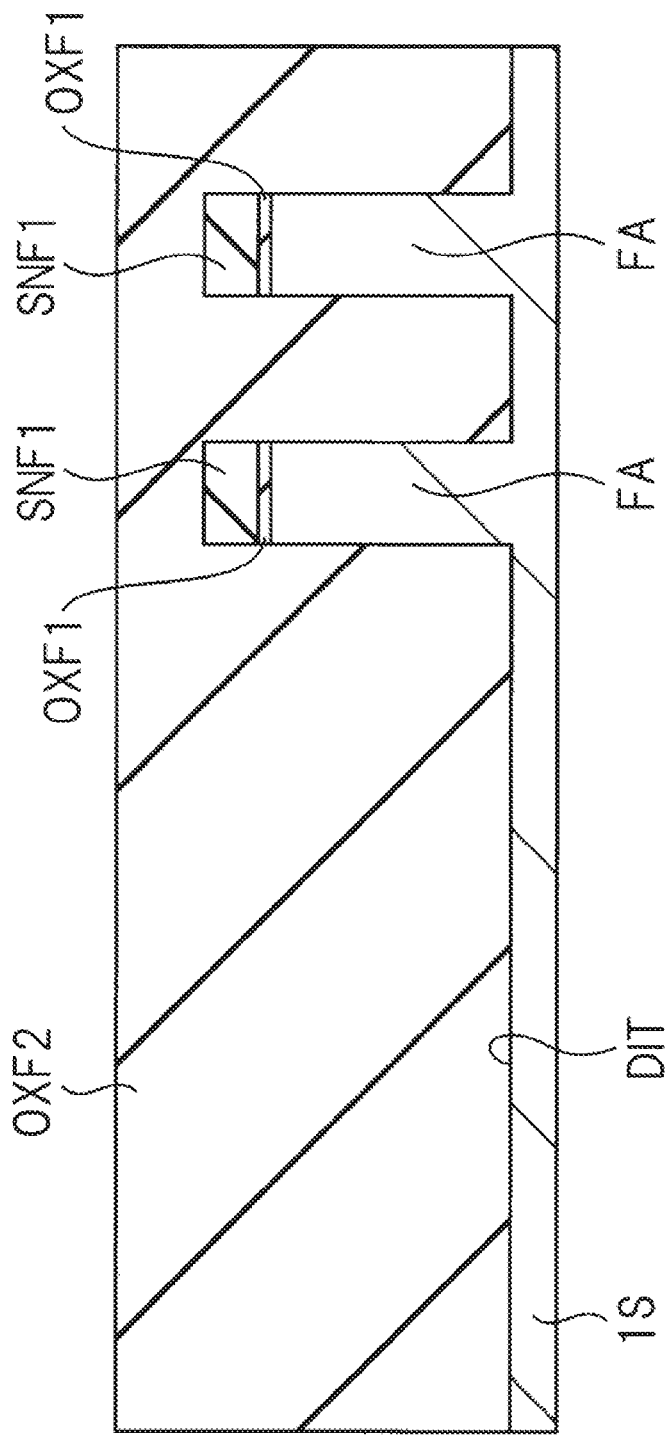
FIG. 3 is a cross-sectional view showing the manufacturing process of the semiconductor device following FIG. 2.
Figure 4:
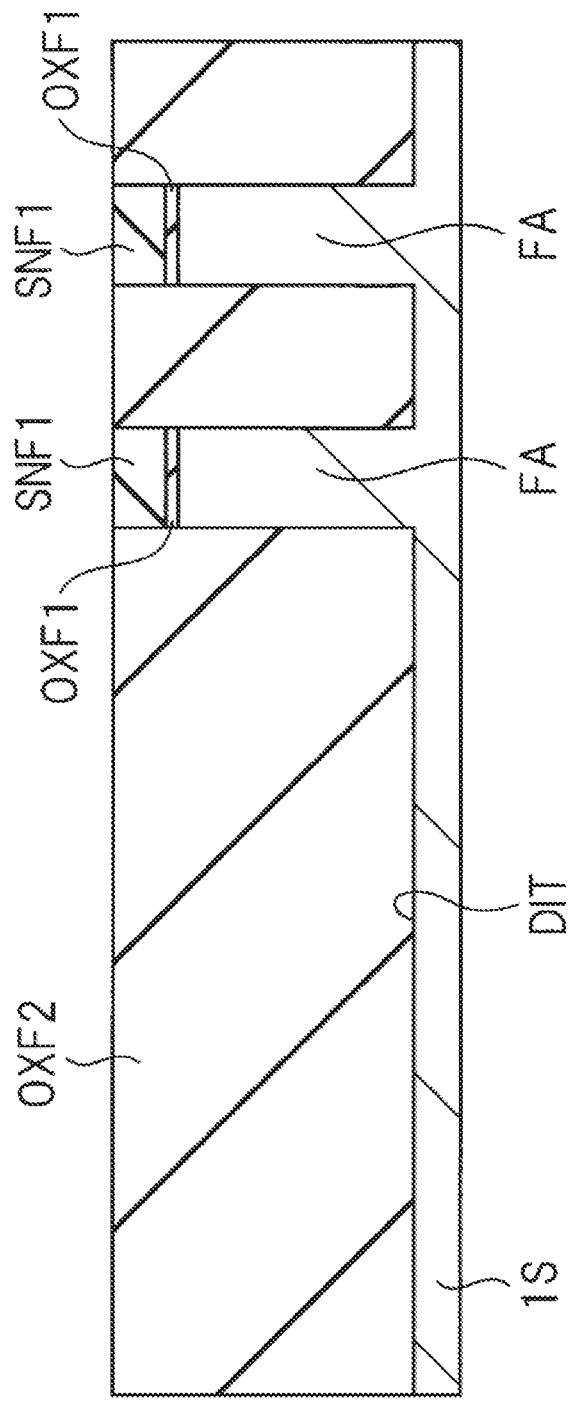
FIG. 4 is a cross-sectional view showing the manufacturing process of the semiconductor device following FIG. 3.
Figure 5:
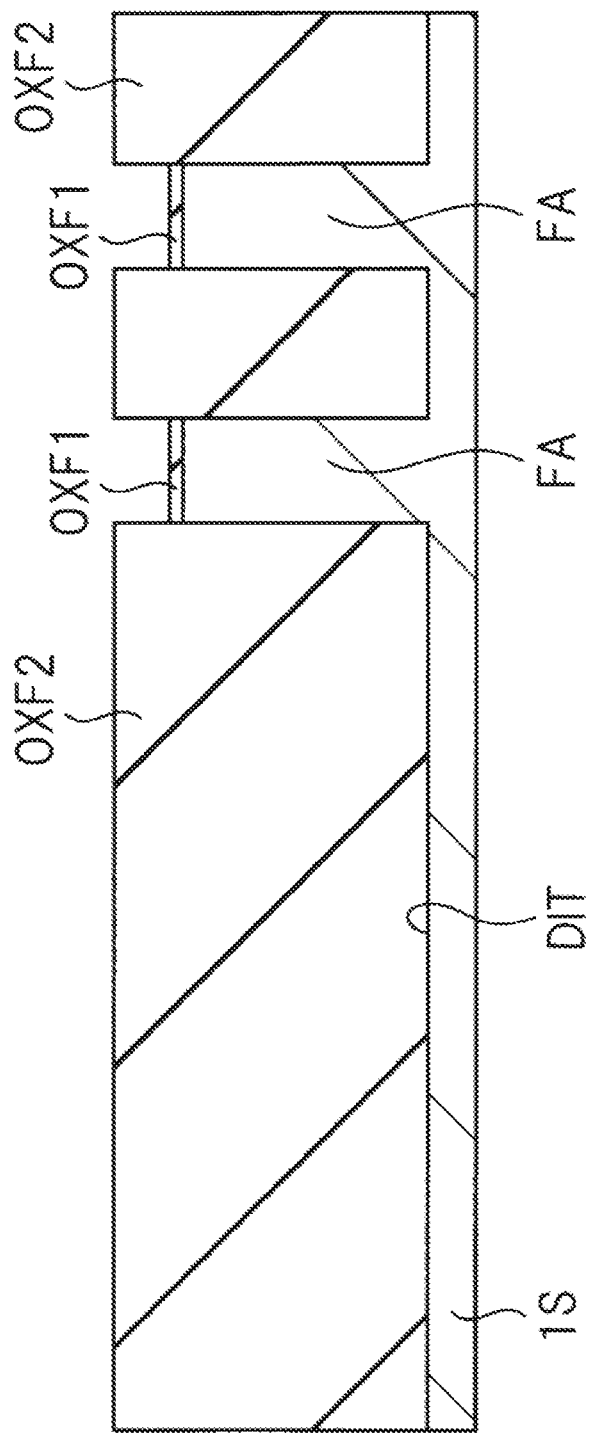
FIG. 5 is a cross-sectional view showing the manufacturing process of the semiconductor device following FIG. 4.
Figure 6:
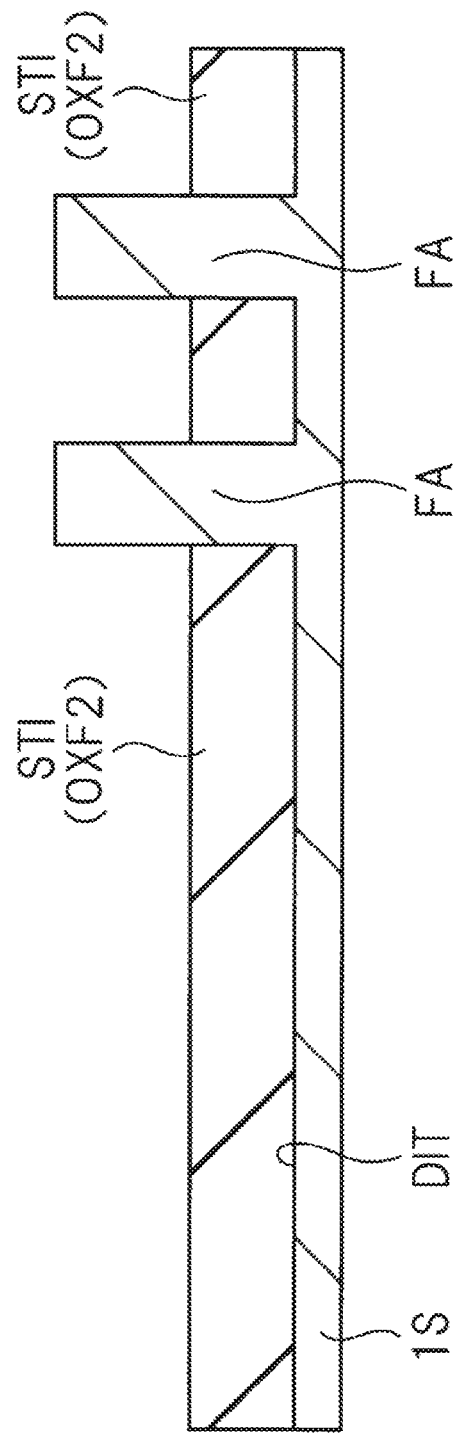
FIG. 6 is a cross-sectional view showing the manufacturing process of the semiconductor device following FIG. 5.

After a silicon oxide film OXF1 is formed on a semiconductor substrate 1S, a silicon nitride film SNF1 is formed on the silicon oxide film OXF1. Thereafter, the silicon nitride film SNF1 and the silicon oxide film OXF1 are patterned using photolithography and etching technique. Then, as shown in FIG. 2, the semiconductor substrate 1S is etched using the patterned silicon nitride film SNF1 and the silicon oxide film OXF1 as hard masks. As a result, the element isolation trench DIT is formed in the semiconductor substrate 1S, and a plurality of fins FA are formed. Next, as shown in FIG. 3, a silicon oxide film OXF2 is formed on the semiconductor substrate 1S on which the element isolation trench DIT and the fins FA are formed by, for example, Chemical Vapor Deposition (CVD) method. Then, as shown in FIG. 4, a surface of the silicon oxide film OXF2 is planarized using, for example, Chemical Mechanical Polishing method. At this time, as shown in FIG. 4, the silicon nitride film SNF1 formed on the fins FA is exposed. Thereafter, as shown in FIG. 5, the silicon nitride film SNF1 formed on the fins FA is removed by wet etching using hot phosphoric acid, for example. Thereafter, as shown in FIG. 6, the silicon oxide film OXF2 is etched back to reduce the thickness of the silicon oxide film OXF2. As a result, as shown in FIG. 6, element isolation regions STI formed by embedding the silicon oxide film OXF2 in a part of the element isolation trench DIT can be obtained, and a part (upper part) of the fins FA can protrude from the silicon oxide film OXF2. Here, the upper surfaces and the side surfaces of the fins FA function as the channel regions of the field effect transistors of the "fin-structure".

Here, for example, as shown in FIG. 6, a step caused by forming a protruding portion of the fins FA is generated between the element isolation region STI and the fins FA.

Figure 7:
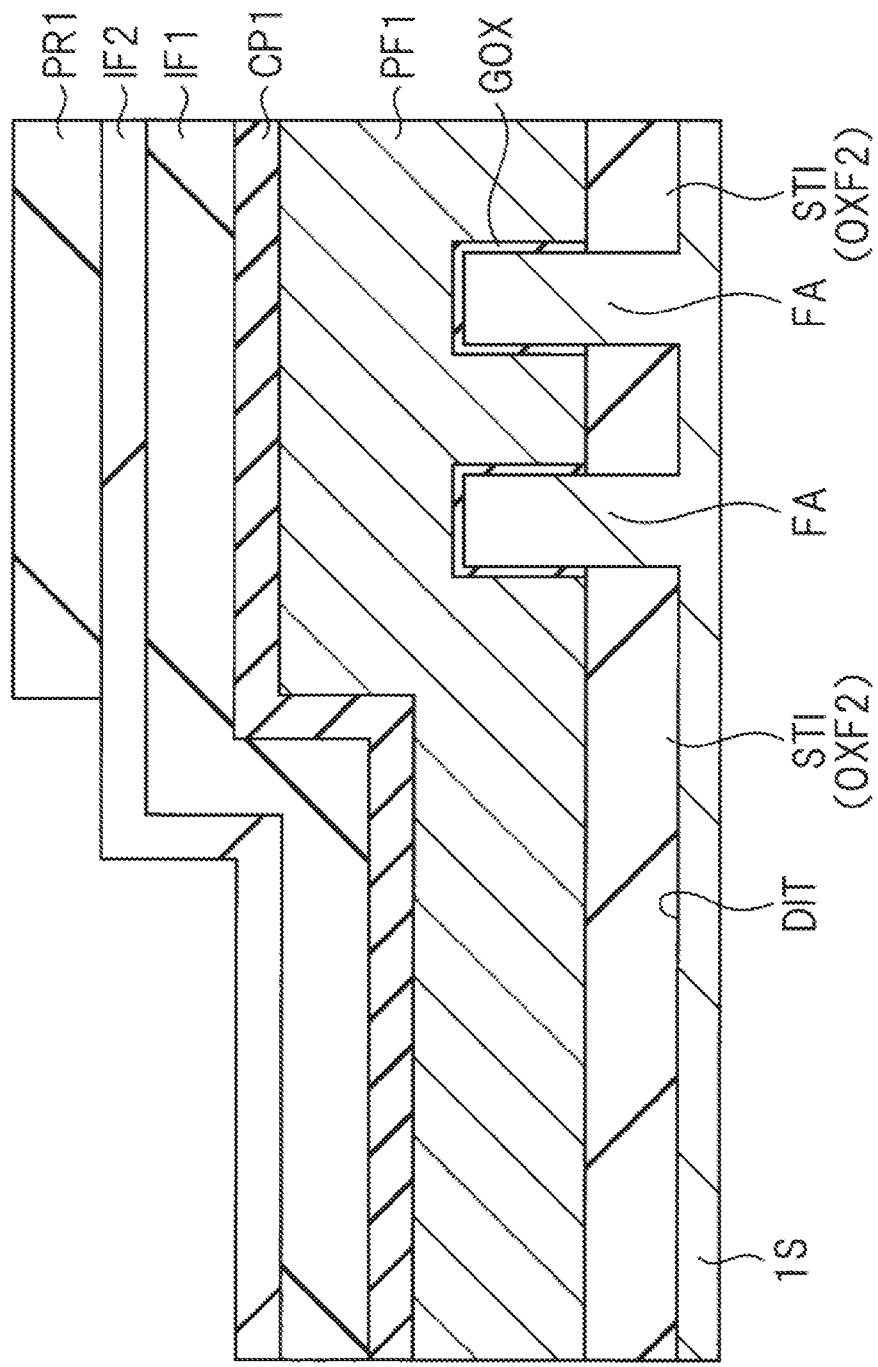
FIG. 7 is a cross-sectional view showing the manufacturing process of the semiconductor device following FIG. 6.
Figure 8:
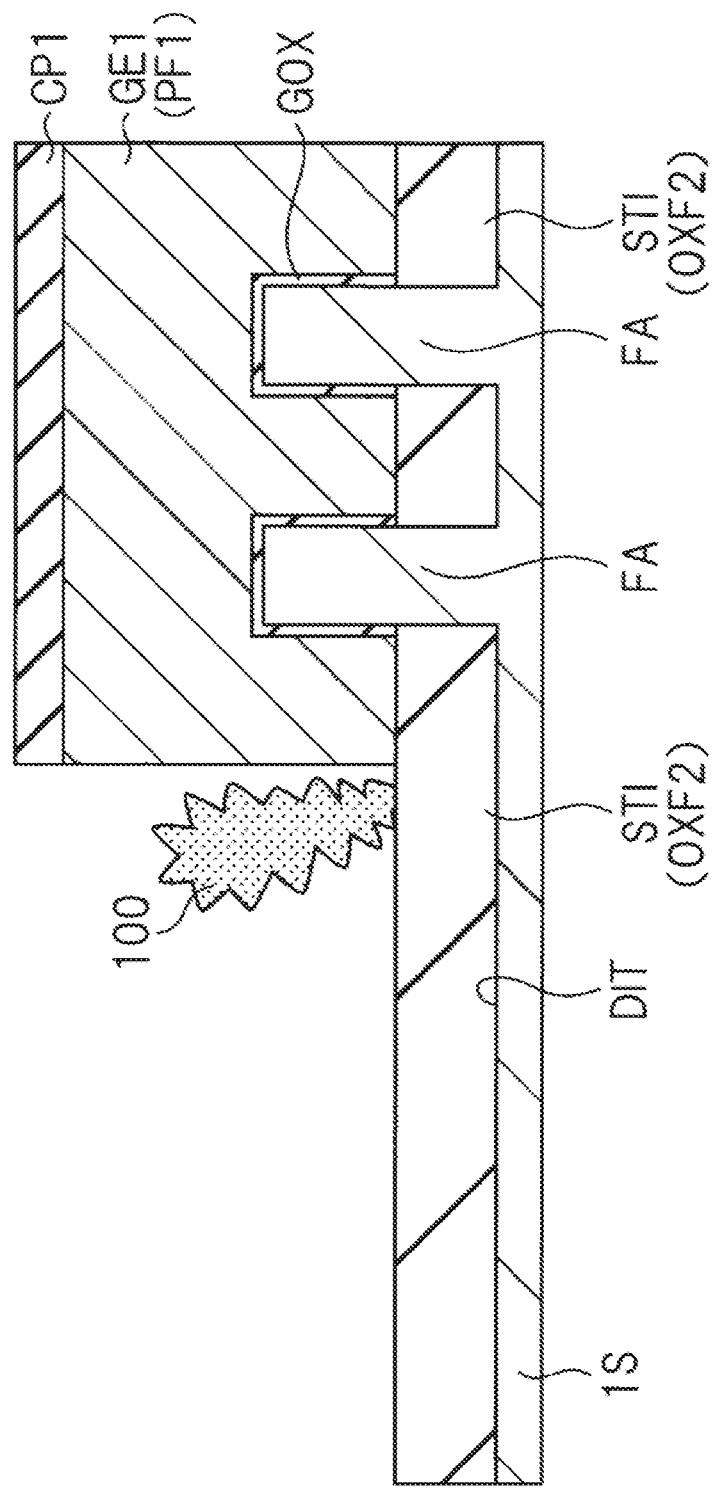
FIG. 8 is a cross-sectional view showing the manufacturing process of the semiconductor device following FIG. 7.

Next, as shown in FIG. 7, gate dielectric films GOX formed of a silicon oxide film is formed over the upper surfaces and the side surfaces of the protruded fins FA by using, for example, thermal oxidation method. Thereafter, as shown in FIG. 7, a polysilicon film PF1 is formed so as to cover the element isolation region STI and the fins FA on which the gate dielectric films GOX are formed, and a cap film CP1 formed of, for example, a silicon nitride film is formed on the polysilicon film PF1. Here, the polysilicon film becomes gate electrodes of the field effect transistors of the "fin-structure" processed in the subsequent step, and when processing the gate electrodes (processing using photolithography technique), the immersion exposure technique is used along with the miniaturization of the gate electrodes. In particular, in FIG. 7, an immersion exposure technique is assumed, in which an insulating film IF1 called a lower layer material is formed on the cap film CP1 formed of a silicon nitride film, and an insulating film IF2 called an intermediate layer is formed on the insulating film IF1. Then, a resist film PR1 is applied on the insulating film IF2 called an intermediate layer. First, the resist film PR1 is patterned by performing exposure and development treatment to the applied resist film PR1, and then the insulating film IF2 and the insulating film IF1 are patterned by etching using the patterned resist film PR1 as a mask. Next, as shown in FIG. 8, the cap film CP1 and the polysilicon film PF1 are patterned by etching using the patterned insulating film IF1 as a hard mask. As a result, as shown in FIG. 8, the gate electrode GE1 formed of the polysilicon film PF1 covering the fins FA can be formed via the gate dielectric film GOX.

Here, the inventors have investigated that, for example, in FIG. 7, due to a step existing between the element isolation region STI and the fins FA, an etching residue 100 is formed when the gate electrode GE1 is formed. This is because, for example, as shown in FIG. 7, in the vicinity of the step existing between the element isolation region STI and the fins FA, film thicknesses of the polysilicon film PF1 and the cap film CP1 is thicker than in other regions due to the step. In particular, when the immersion exposure technique is used to process the gate electrode GE1, since the insulating film IF1 and the insulating film IF2 are formed on the cap film CP1, the thickness of the gate electrode in the vicinity of the step is thicker, so that the etching residue 100 due to the insufficient etching easily occurs.

Figure 9:
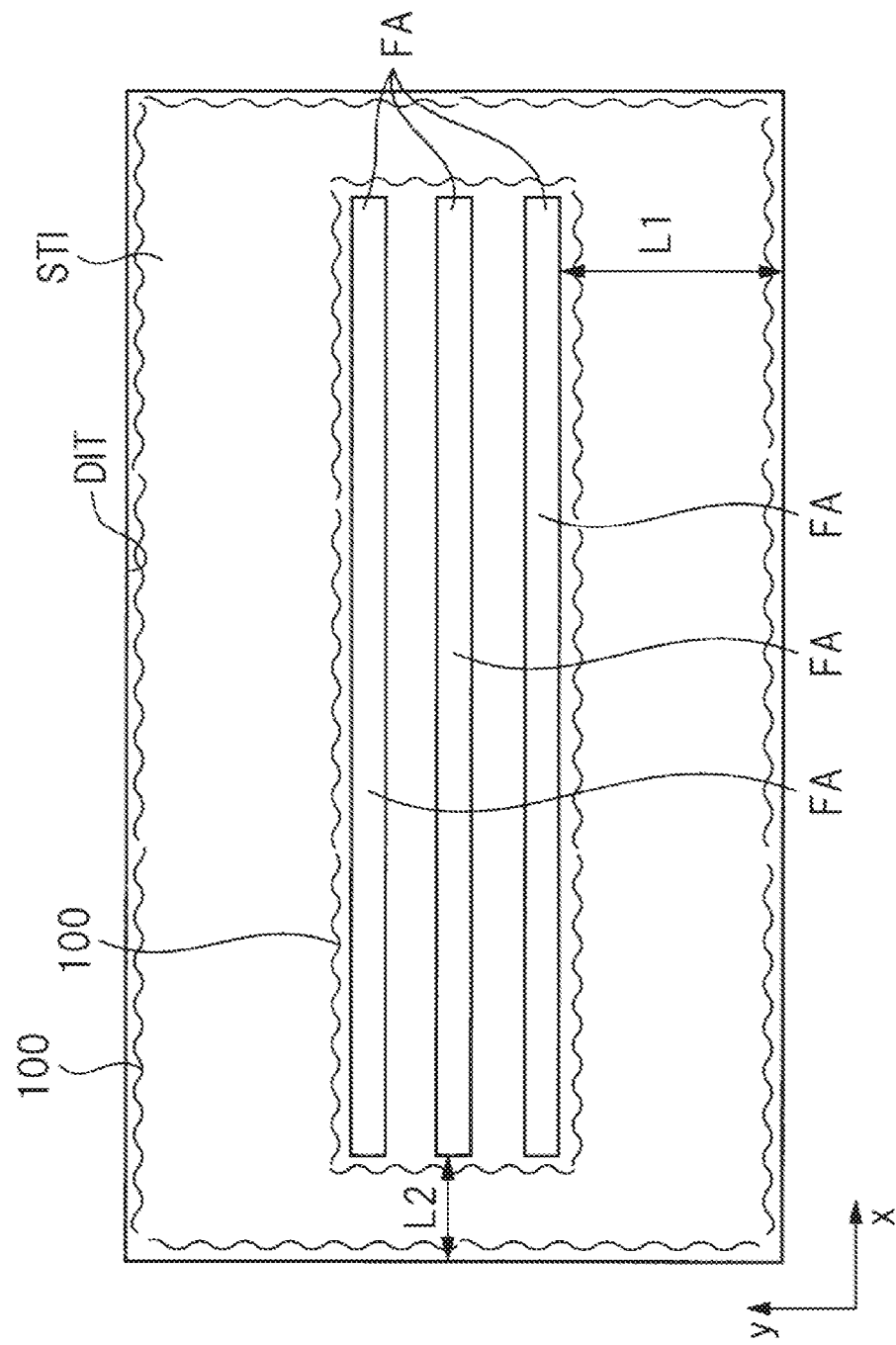
FIG. 9 is a diagram showing a schematic state in which an etching residue is generated.

FIG. 9 is a diagram showing a schematic state in which the etching residue 100 is generated. As shown in FIG. 9, etch residues 100 are formed in a near region of the element isolation trench DIT and a near region surrounding the entire plurality of fins FA. This is because a step is generated when the silicon oxide film constituting the element isolation region STI is etched back in the near region of the element isolation trench DIT and the near region surrounding the entire plurality of fins FA. In particular, according to the study by the present inventor, in FIG. 9, when the distance L1 between the fin FA arranged outermost in the Y direction of the plurality of fins FA and the element isolation trench DIT is twice or more the deposited film thickness of the polysilicon film PF1 shown in FIG. 7, the etching residues 100 caused by the step are likely to be formed. Similarly, according to the study by the present inventor, in FIG. 9, even when the distances L2 between the end portions of the plurality of fins FA in the X direction and the element isolation trench DIT are twice or more the deposited film thickness of the polysilicon film PF1 shown in FIG. 7, the etching residues 100 caused by the step are likely to be formed. This is because, as a result of the polysilicon film PF1 being formed reflecting the step, the film thickness of the polysilicon film PF1 becomes thick in the vicinity of the step.

When such etching residues 100 are generated, a short-circuit defect is occurred between the gate electrodes GE1 due to the etching residues 100, and the reliability of the semiconductor device is likely to be lowered. In addition, in a cleaning step performed after this step, the etching residues 100 are lifted off and reattached on the semiconductor substrate 1S (semiconductor wafer) as a foreign substance, which may cause an abnormal shape of the field effect transistor or an impurity injection obstruction, and may cause a decrease in yield of semiconductor device (semiconductor products). Therefore, from the viewpoint of improving the reliability of the semiconductor device and improving the manufacturing yield of the semiconductor device, there is a need to devise so as not to generate the etching residues 100 as much as possible.

In this regard, for example, in FIG. 7, it is considered that after forming the polysilicon film PF1, the surface of the polysilicon film PF1 is planarized by using, for example, CMP method to eliminate a step formed on the polysilicon film PF1. However, since the thickness of the polysilicon film PF1 on the fin FA is reduced, the gate electrode GE1 may not be formed on the fin FA. Further, when the polysilicon film PF1 is planarized, the upper surface of the fins FA may be scraped. For this reason, for example, there is a need to devise a method of suppressing a step from being formed on the polysilicon film PF1 by a method other than the planarization process of the polysilicon film PF1 by the CMP method. Therefore, in the first embodiment, a contrivance is made for the above-mentioned room for improvement. Hereinafter, the technical idea of the first embodiment to which this device is applied will be described.

Layout Configuration of Fin

Figure 10:
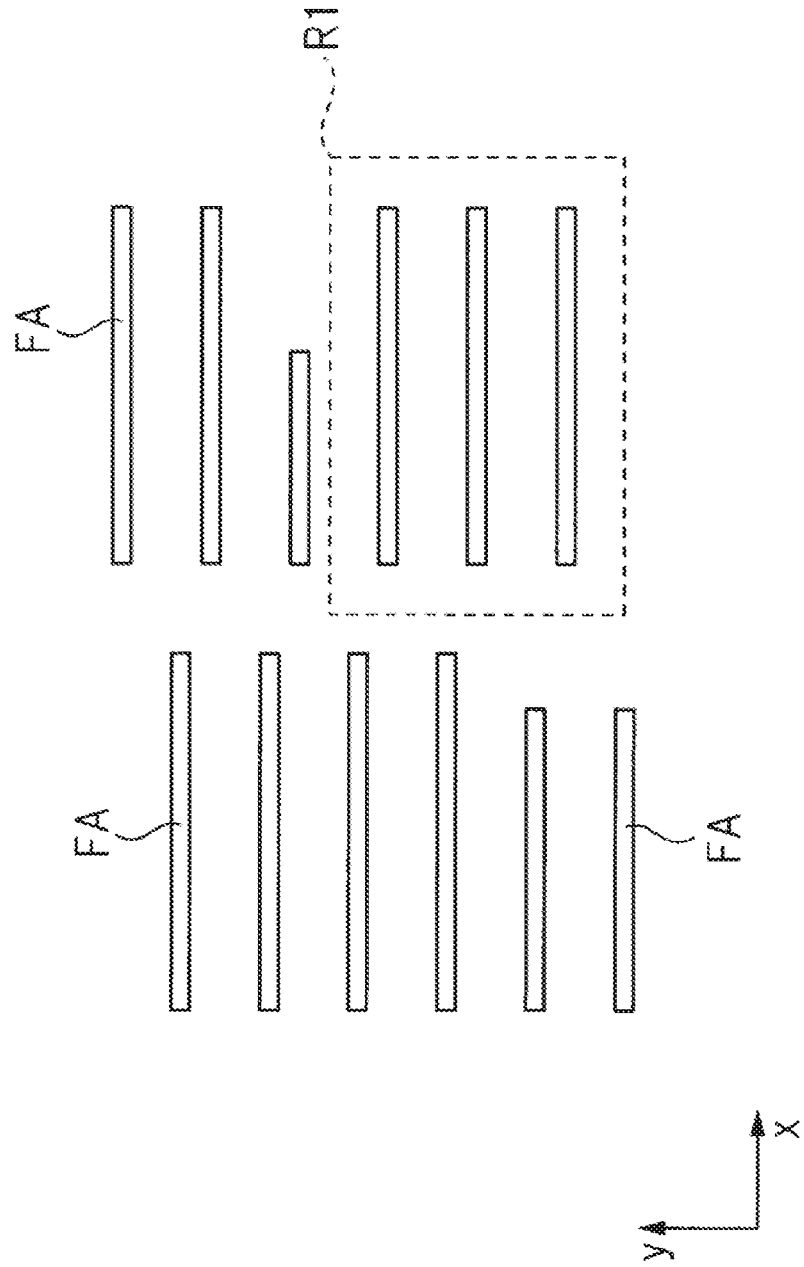
FIG. 10 is a diagram showing a schematic layout configuration of fins in field effect transistors of the "fin-structure".

FIG. 10 is a diagram showing a schematic layout configuration of fins in the field effect transistor of the "fin-structure". In FIG. 10, the fins FA are arranged at predetermined intervals in the Y direction, and each of the plurality of fins FA extends in the X direction orthogonal to the Y direction.

Figure 11:
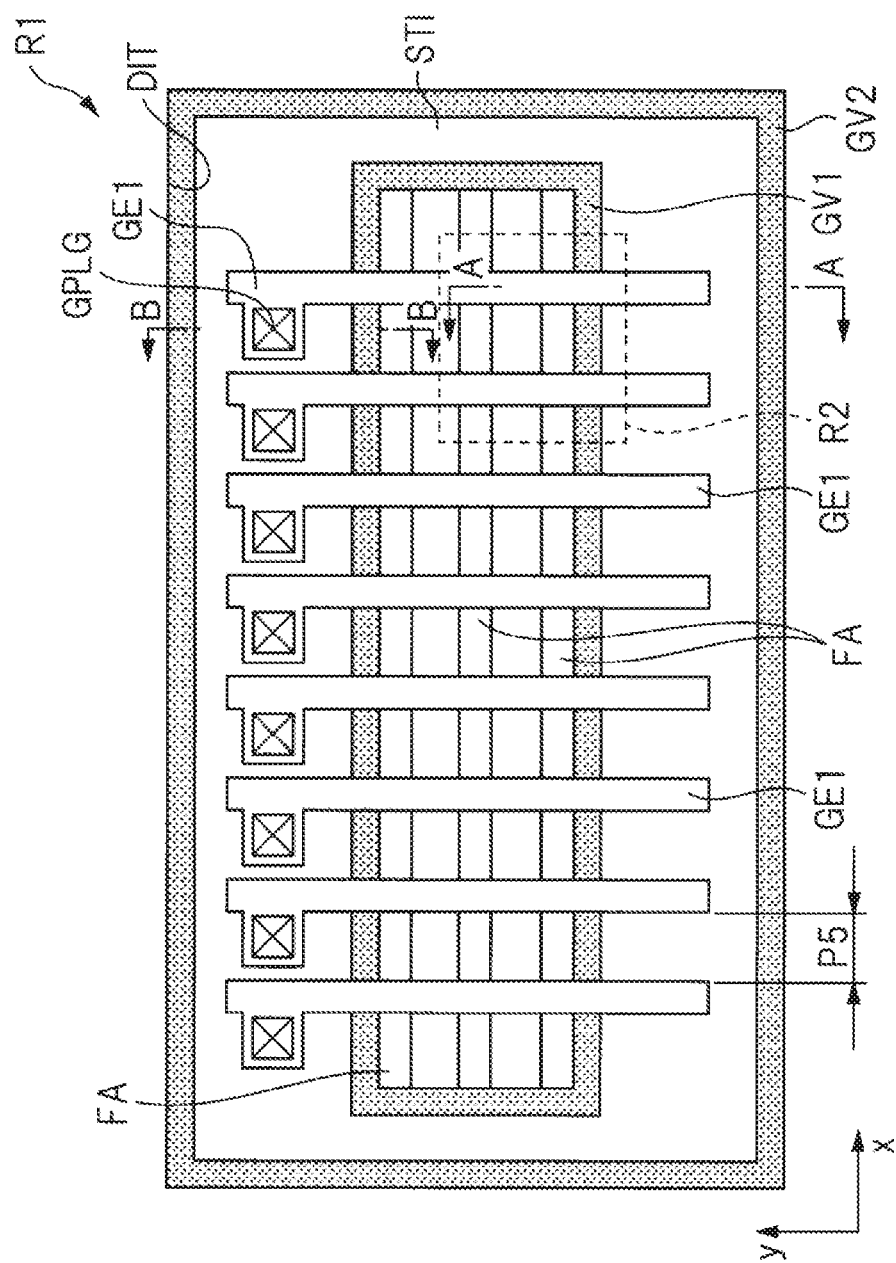
FIG. 11 is an enlarged view of a region R1 of FIG. 10.

FIG. 11 is an enlarged view of the region R1 of FIG. 10. In FIG. 11, the plurality of fins FA are arranged at predetermined intervals in the Y direction, and each of the plurality of fins FA is arranged so as to extend in the X direction orthogonal to the Y direction. The region in which the plurality of fins FA are formed is referred to as a "first region". In FIG. 11, an element isolation region STI is formed so as to divide the "first region" in which a plurality of fins FA are formed. The element isolation region STI is configured to include an element isolation trench DIT formed on the semiconductor substrate and an insulating film (for example, a silicon oxide film) embedded in the element isolation trench DIT.

As shown in FIG. 11, a recess portion GV1 surrounding the plurality of fins FA in plan view is formed on the surface of the insulating film embedded in the element isolation trench DIT. The width of the recess portion GV1 is equal to or less than a predetermined interval, which is the interval between the fins FA adjacent to each other. Further, in FIG. 11, a recess portion GV2 is formed on the surface of the insulating film embedded in the element isolation trench DIT so as to surround the recess portion GV1 apart from each other in plan view, and the width of the recess portion GV2 is also equal to or less than a predetermined interval which is the interval between the fins FA adjacent to each other.

Subsequently, a plurality of gate electrodes GE1 are arranged so as to extend in the Y direction and intersect with the plurality of fins FA. The gate electrodes GE1 are electrically connected to the gate plugs GPLG. The gate plugs GPLG have a function of supplying gate voltages to the gate electrodes GE1, and are arranged between the recess portion GV1 and the recess portion GV2 in plan view. In other words, as shown in FIG. 11, in plan view, the element isolation region STI includes a "first region" (array forming region) in which a plurality of fins are formed and a power supply portion including a gate plug GPLG formed on the outer side of the "first region".

Although not shown in FIG. 11, other circuit forming regions typified by, for example, peripheral circuit forming regions are formed outside the recess portion GV2 formed in the outer edge region of the element isolation region STI shown in FIG. 11. That is, for example, a peripheral circuit forming regions are formed so as to surround the recess portion GV2 formed in the outer edge region of the element isolation region STI shown in FIG. 11. Further, as shown in FIG. 11, in plan view, between the recess portion GV1 and the recess portion GV2, a power supply portion (for example, a portion where the gate plugs GPLG are formed) for supplying potentials to the field effect transistors of the "fin-structure" formed in the "first region" in which the plurality of fins FA are formed is formed.

As described above, the fins FA of the field effect transistors of the "fin-structure" are configured in a layout.

Schematic Configuration of Field Effect Transistor of "Fin-Structure"

Figure 12:
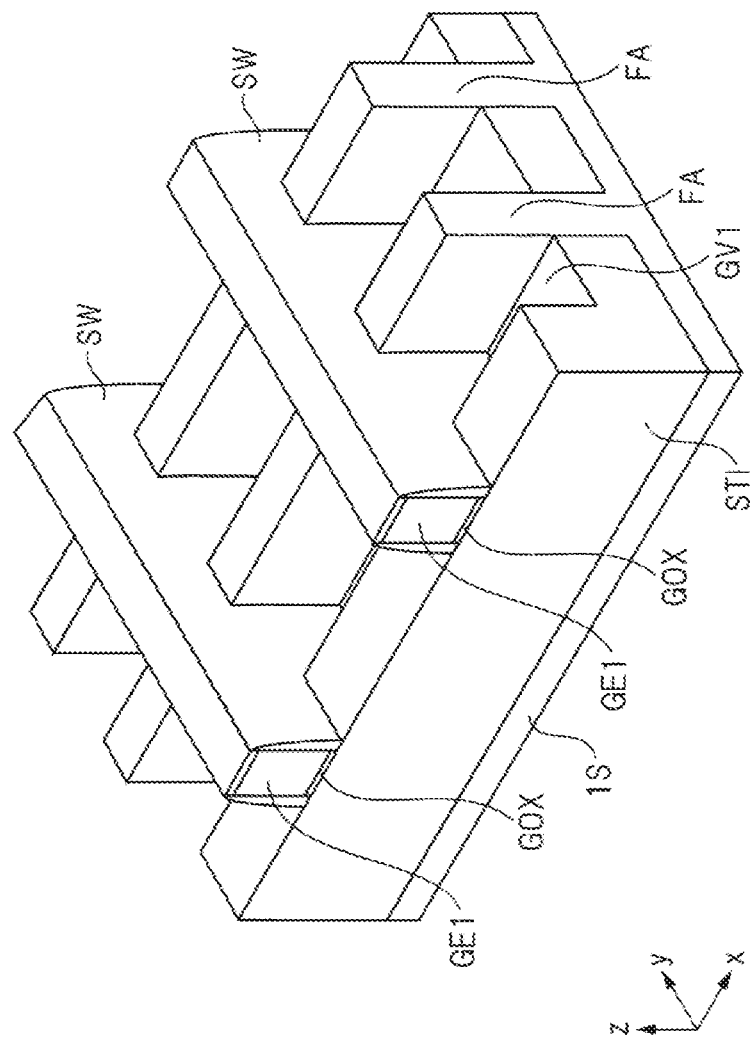
FIG. 12 is a perspective view showing a schematic configuration of the field effect transistors of the "fin-structure" formed in a region R2 shown in FIG. 11.

FIG. 12 is a perspective view showing a schematic configuration of field effect transistors of a "fin-structure" formed in a region R2 shown in FIG. 11. As shown in FIG. 12, the field effect transistor of the "fin-structure" in the first embodiment has a fin FA formed by processing the semiconductor substrate 1S, and the fin FA is sandwiched between element isolation regions STI. the recess portion GV1 is formed on the surface of the element isolation region STI in contact with the fin FA. The recess portion GV1 extends along the X direction in which the fin FA extends. The field effect transistor of the "fin-structure" in the first embodiment has a gate electrode GE1 straddling the fin FA and extending in the Y direction, and a gate dielectric film GOX formed of, for example, a silicon oxide film is formed under the gate electrode GE1. On the other hand, sidewall spacers SW formed of insulating films are formed on both sidewalls of the gate electrode GE1. According to the field effect transistor of the "fin-structure" configured as described above, the gate electrode GE1 is formed via the gate dielectric film GOX so as to cover the upper surface and the side surfaces of the fin FA protruding from the element isolation region STI. Therefore, since the upper surface and the side surfaces of the fin FA covered with the gate electrode GE1 function as the channel forming region, the field effect transistor of the "fin-structure" can improve the performance compared to the field effect transistor of the "planar-type" having no fin FA.

Method for Manufacturing Field Effect Transistors of "Fin-Structure"

The field effect transistor of the "fin-structure" in the first embodiment is configured as described above, and its manufacturing method will be described below referring to the drawings. In the drawings for explaining the manufacturing process, a cross-sectional view cut along the line A-A in FIG. 11 is used.

Figure 13:
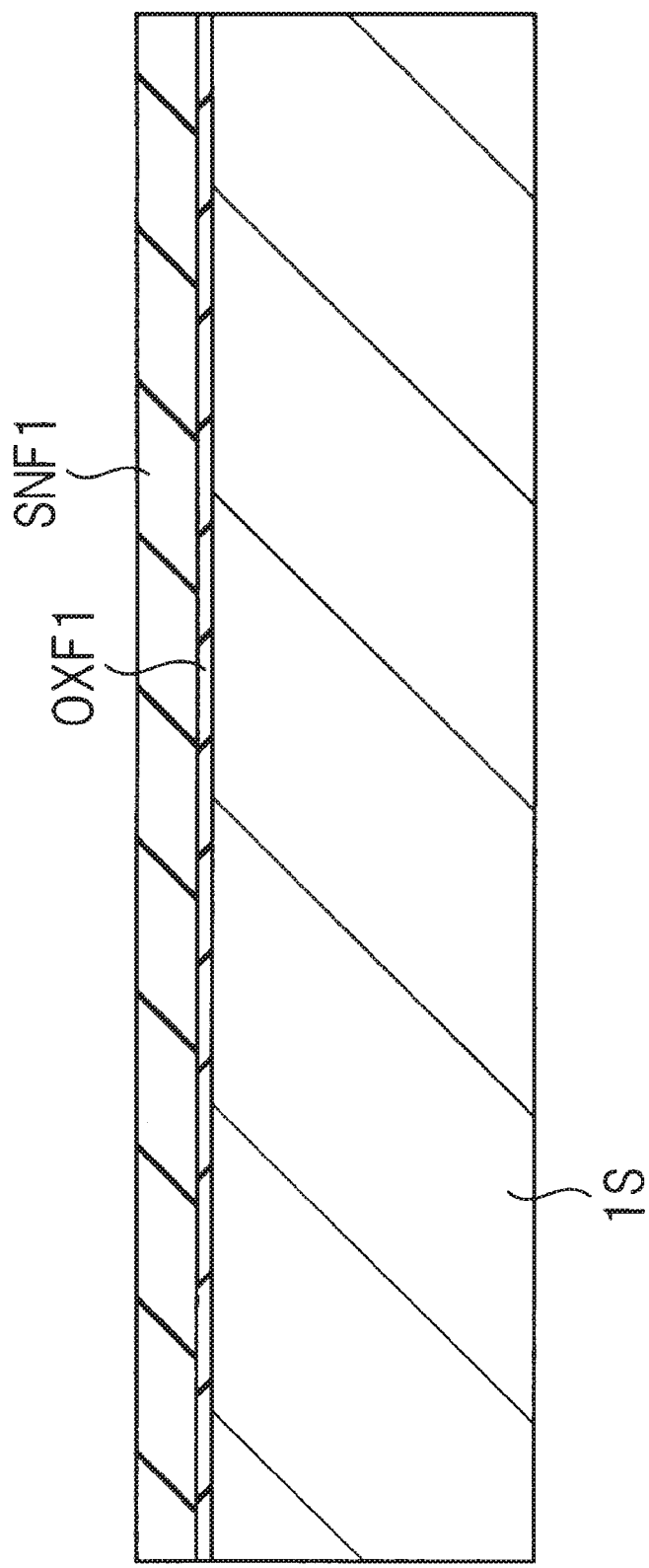
FIG. 13 is a cross-sectional view showing a manufacturing process of semiconductor device according to first embodiment.

First, as shown in FIG. 13, for example, a semiconductor substrate 1S (semiconductor wafer) made of a silicon single crystal is prepared, a silicon oxide film OXF1 is formed on the semiconductor substrate 1S, and then a silicon nitride film SNF1 is formed on the silicon oxide film OXF1. The silicon oxide film OXF1 is formed by using thermal oxidation method, for example, and the silicon nitride film SNF1 is formed by using CVD method, for example.

Figure 14:
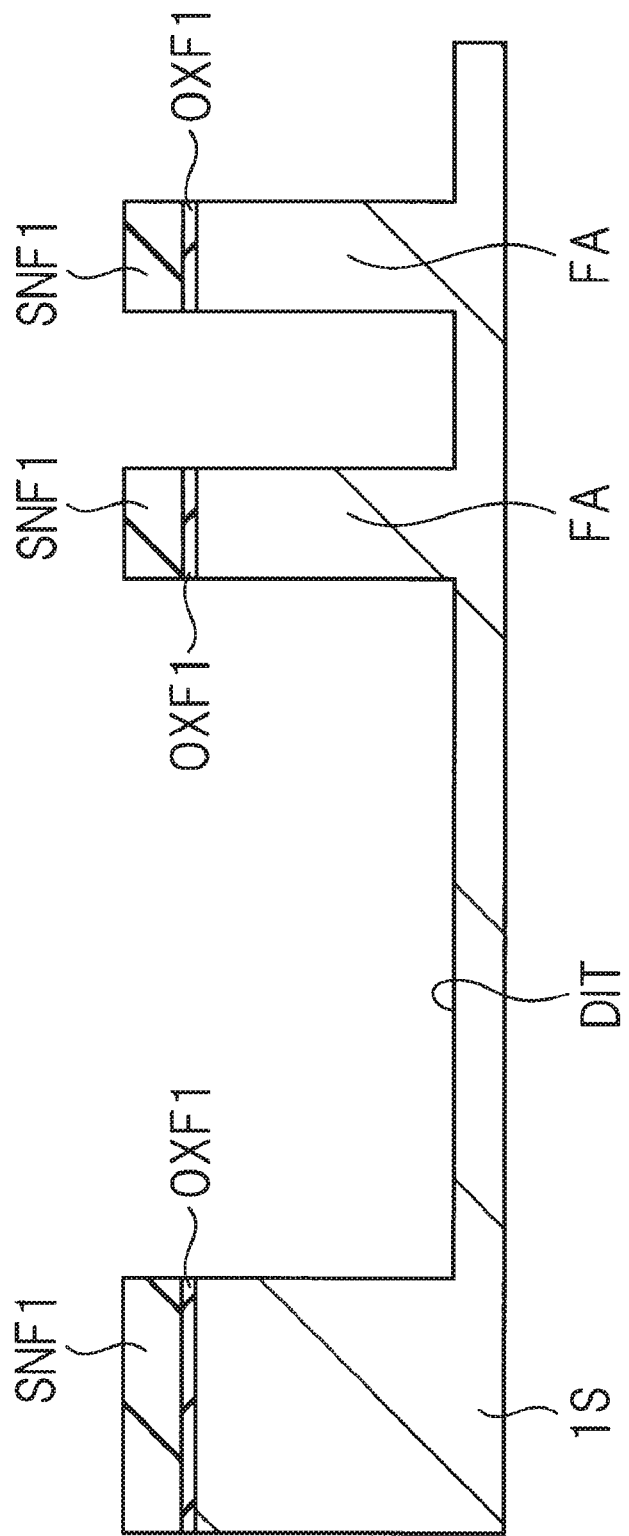
FIG. 14 is a cross-sectional view showing the manufacturing process of the semiconductor device following FIG. 13.

Next, the silicon nitride film SNF1 and the silicon oxide film OXF1 are patterned by using photolithography technique and etching technique. Then, as shown in FIG. 14, the semiconductor substrate 1S is processed by etching technique using the patterned silicon nitride film SNF1 and the silicon oxide film OXF1 as hard masks. Specifically, as shown in FIG. 14, the semiconductor substrate 1S is processed to form a plurality of fins FA arranged at predetermined intervals in the Y direction (see FIG. 11, first direction) and extending in the X direction (see FIG. 11, second direction) perpendicular to the Y direction, respectively, and an element isolation trench DIT including the plurality of fins FA in plan view (see FIG. 11).

Figure 15:
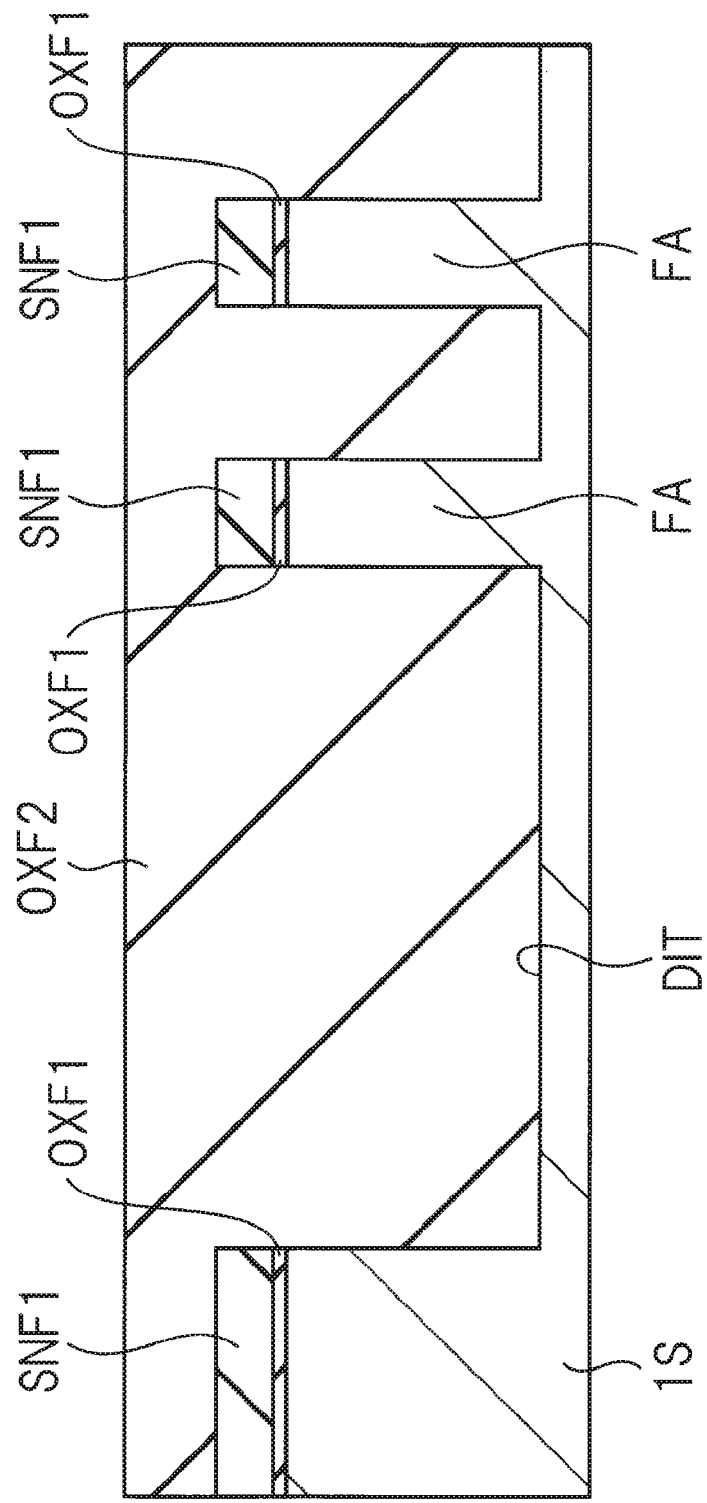
FIG. 15 is a cross-sectional view showing the manufacturing process of the semiconductor device following FIG. 14.
Figure 16:
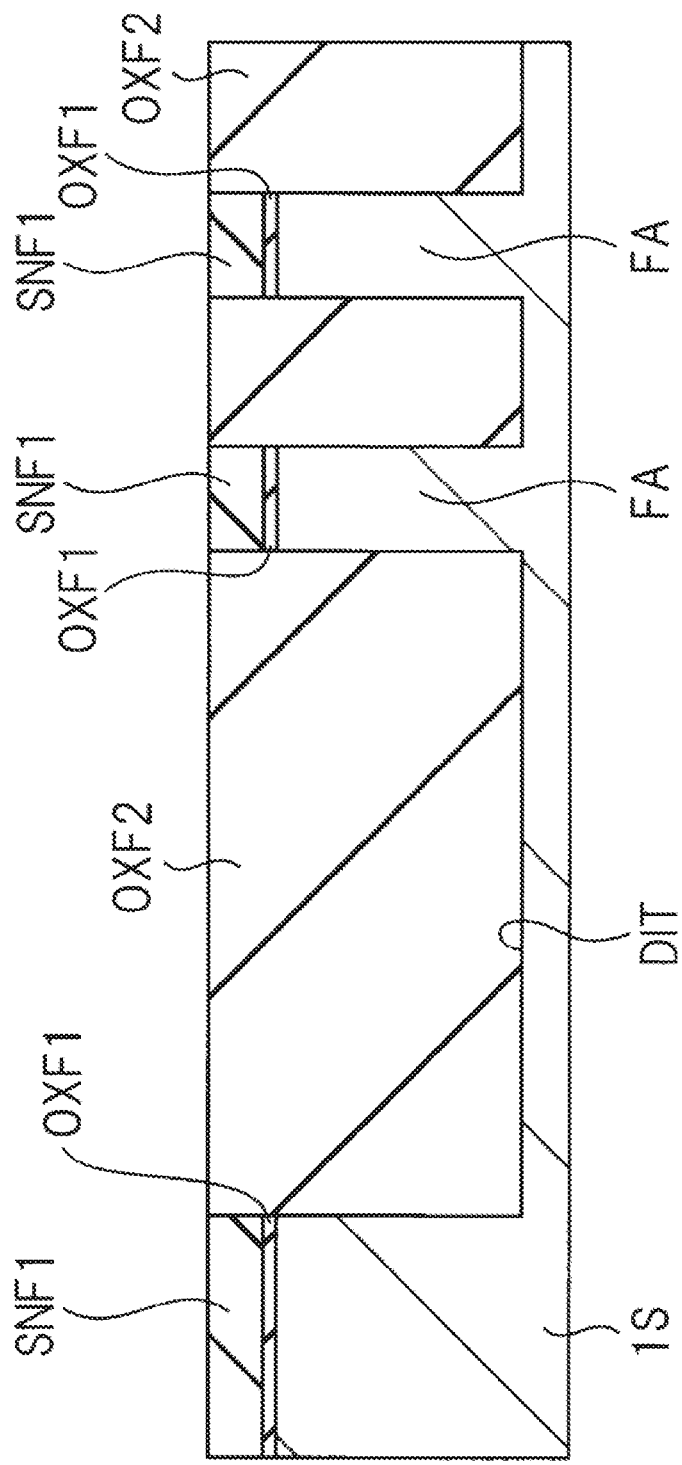
FIG. 16 is a cross-sectional view showing the manufacturing process of the semiconductor device following FIG. 15.

Next, as shown in FIG. 15, a silicon oxide film OXF2 is formed on the semiconductor substrate 1S on which the fins FA and the element isolation trench DIT are formed. As a result, the silicon oxide film OXF2 is embedded between the fins FA adjacent to each other and inside the element isolation trench DIT. Thereafter, as shown in FIG. 16, the surface of the silicon oxide film OXF2 is polished by using, for example, CMP method. As a result, the surfaces of the silicon nitride films SNF1 formed on the fins FA via the silicon oxide films OXF1 are exposed.

Figure 17:
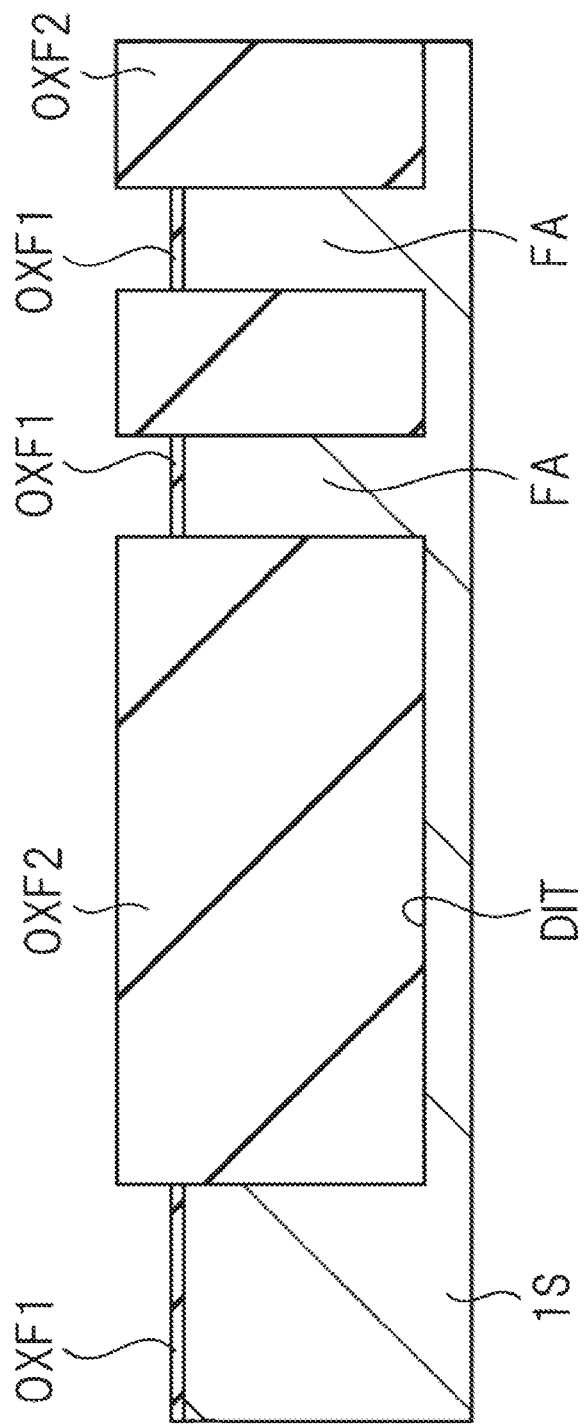
FIG. 17 is a cross-sectional view showing the manufacturing process of the semiconductor device following FIG. 16.

Next, as shown in FIG. 17, the silicon nitride films SNF1 formed on the fins FA via the silicon oxide films OXF1 are removed by using, for example, hot phosphoric acid. Thereafter, the silicon oxide film OXF2 is etched so that the surface height of the silicon oxide film is equal to the surface height of the fins FA. Since the silicon oxide films OXF1 is also removed by this etching, the silicon oxide films OXF is subsequently formed on the fins FA.

Figure 18:
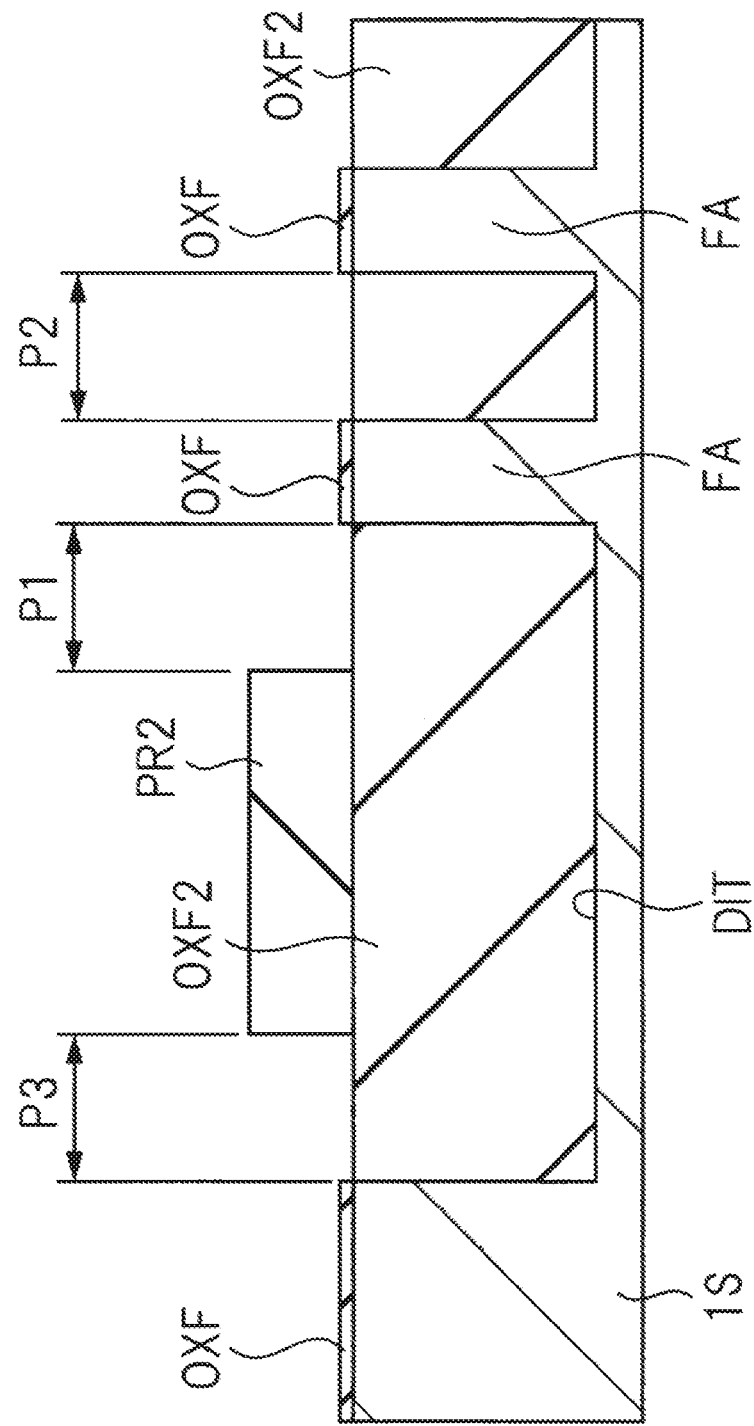
FIG. 18 is a cross-sectional view showing the manufacturing process of the semiconductor device following FIG. 17.

Subsequently, as shown in FIG. 18, for example, a resist pattern PR2 is formed on the silicon oxide film OXF2 formed so as to embed the element isolation trench DIT by using photolithography technique and etching technique. More specifically, FIG. 19 shows that the resist pattern PR2 is formed on the silicon oxide film OXF2 which is embedded in the element isolation trench DIT as a pattern which is included in the element isolation trench DIT and which surrounds the entire plurality of fins FA in plan view.

Figure 19:
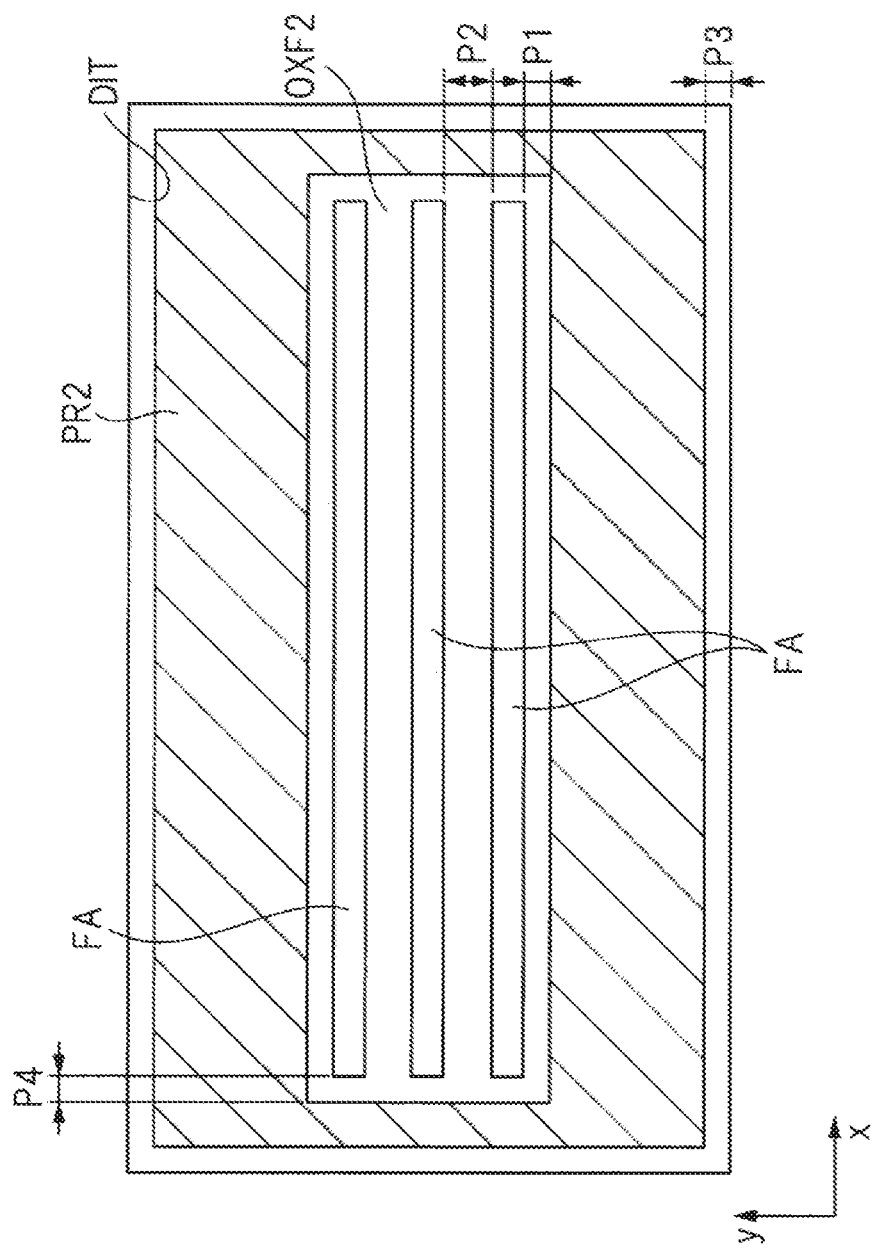
FIG. 19 is a plan view showing a state that a resist pattern is formed on a silicon oxide film which embeds an element isolation trench as a pattern which is included in the element isolation trench and surrounds the entire plurality of fins in plan view.

Here, in FIG. 19, for example, the distance P1 between the fin FA of the plurality of fins FA arranged outermost in the Y direction and the resist pattern PR2 is equal to or less than the distance P2 (predetermined interval) between the fins FA adjacent to each other. The distance P3 between the resist pattern PR2 and the element isolation trench DIT is also equal to or less than the distance P2 (predetermined interval) between the fins FA adjacent to each other. Further, in FIG. 19, the distance P4 between the end portions of the plurality of fins FA in the X direction and the resist pattern PR2 is also equal to or less than the distance P2 (predetermined interval) between the fins FA adjacent to each other.

Figure 20:
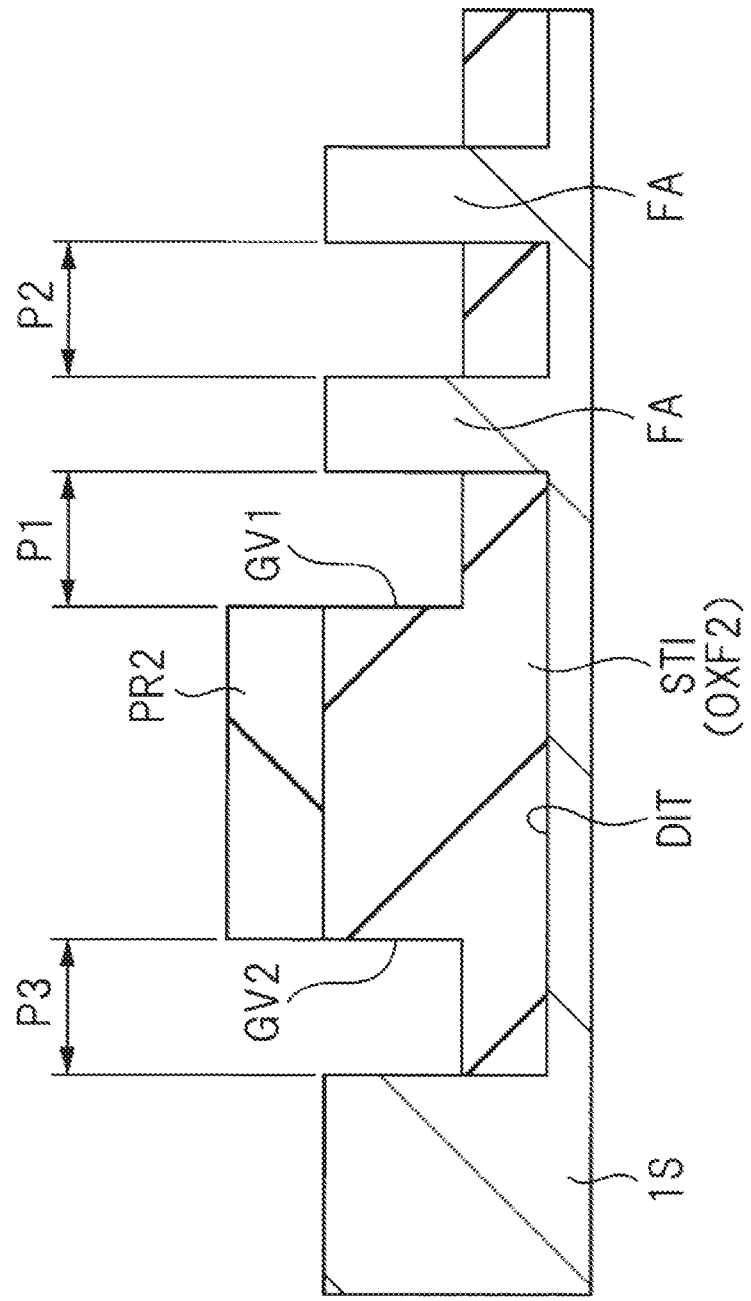
FIG. 20 is a cross-sectional view showing the manufacturing process of the semiconductor device following FIG. 18.

Subsequently, as shown in FIG. 20, the thickness of the silicon oxide film OXF2 exposed from the resist pattern PR2 is reduced by etching using the resist pattern PR2 as a mask. As a result, the recess portion GV1 in contact with the fin FA arranged on the outermost periphery is formed on the surface of the silicon oxide film OXF2, and the recess portion GV2 in contact with the outer periphery region of the element isolation trench DIT is formed on the surface of the silicon oxide film OXF2. In other words, as shown in FIG. 20, a convex shape sandwiched between the recess portion GV1 and the recess portion GV2 is formed on the surface of the silicon oxide film OXF2. As a result, as shown in FIG. 20, the element isolation region STI in which the recess portion GV1 and the recess portion GV2 are formed can be formed.

Here, anisotropic etching such as dry etching or isotropic etching such as wet etching can be used for etching using the resist pattern PR2 as a mask. However, when the isotropic etching is used, the distance P1 between the fin FA arranged outermost in the Y direction of the plurality of fins FA and the resist pattern PR2 is desirably smaller than the distance P2 between the fins FA adjacent to each other. The distance P3 between the resist pattern PR2 and the element isolation trench DIT is also desirably smaller than the distance P2 between the fins FA adjacent to each other. Similarly, when isotropic etching is used, the distance P4 between the end portions of the plurality of fins FA in the X direction and the resist pattern PR2 is preferably smaller than the distance P2 between the fins FA adjacent to each other. The reason will be described later.

Figure 21:
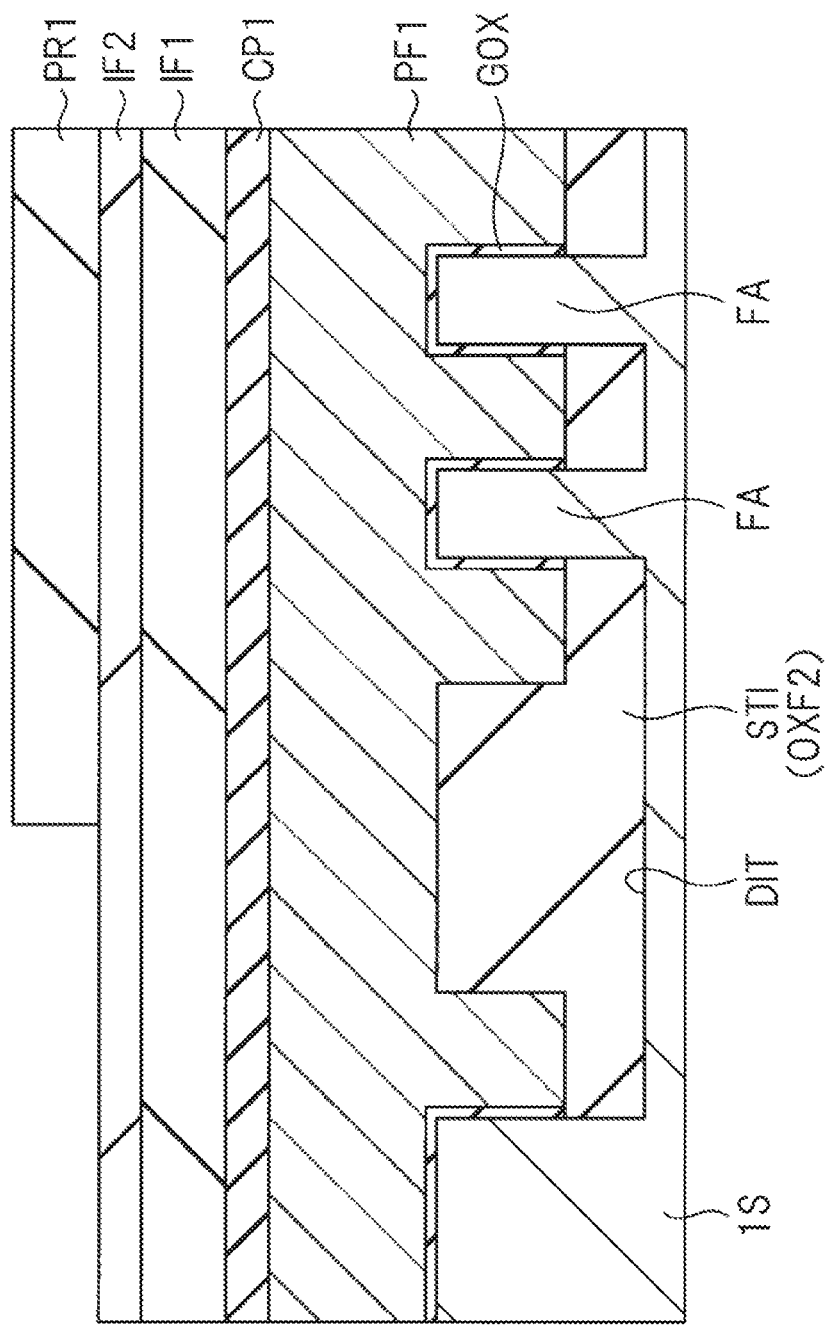
FIG. 21 is a cross-sectional view showing the manufacturing process of the semiconductor device following FIG. 20.

Next, as shown in FIG. 21, a gate dielectric film GOX formed of, for example, a silicon oxide film is formed on the surface of each of the plurality of fins FA. Thereafter, a polysilicon film PF1 is formed so as to cover the silicon oxide films OXF2 and a plurality of fins FA on which gate dielectric films GOX are formed. The polysilicon film PF1 can be formed by using, for example, CVD method. At this time, as shown in FIG. 20, in the first embodiment, since the etching of the element isolation region STI is performed using the resist pattern PR2 as a mask, as shown in FIG. 20, the entire element isolation region STI is not etched back, and a portion having convex shape is formed on the element isolation region STI. In other words, the thickness of the silicon oxide film OXF2 decreases only in regions where the resist pattern PR2 is not formed, and a narrow recess portion GV1 and a narrow recess portion GV2 are formed. Thus, for example, as shown in FIG. 21, when the polysilicon film PF1 is formed, the element isolation region STI is formed with a narrow recess portion GV1 and a narrow recess portion GV2, while the element isolation region STI sandwiched between the recess portion GV1 and the recess portion GV2 is not recessed. As a result, when the polysilicon film PF1 is formed, it is possible to embed the narrow recess portion GV1 and the narrow recess portion GV2 with the polysilicon film PF1 without impairing the flatness of the surface of the polysilicon film PF1. As a result, as shown in FIG. 21, a step does not occur on the polysilicon film PF1.

Thereafter, as shown in FIG. 21, a cap film CP1 formed of, for example, a silicon nitride film is formed on the polysilicon film PF1 whose flatness is ensured. At this time, while the cap film CP1 may be formed on the polysilicon film PF1 and patterned using photolithography technique and etching technique, in FIG. 21, since the patterning of the polysilicon film PF1 is performed by the immersion exposure technique, the insulating film IF1 and the insulating film IF2 are formed and then the patterned resist film PR1 is formed.

Figure 22:
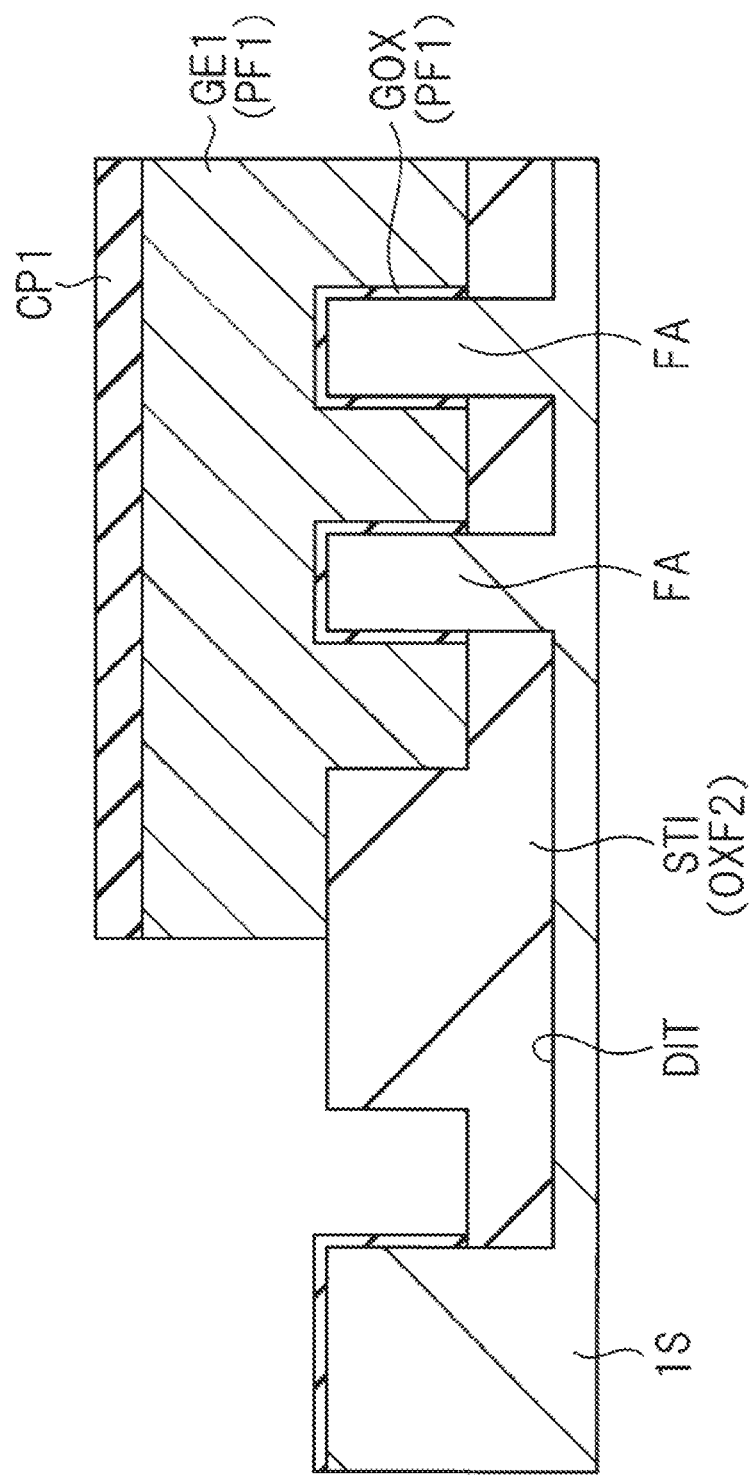
FIG. 22 is a cross-sectional view showing the manufacturing process of the semiconductor device following FIG. 21.

Then, as shown in FIG. 22, by processing the polysilicon film PF1 using photolithography technique and etching technique, the gate electrode GE1 straddling the fins FA and extending in the Y direction can be formed. Here, for example, in FIG. 19, it is desirable that the distance P1 between the fin FA of the plurality of fins FA arranged outermost in the Y direction and the resist pattern PR2 is equal to or larger than the distance P5 between the gate electrodes GE1 adjacent to each other shown in FIG. 11. The reason will be described later.

Figure 23:
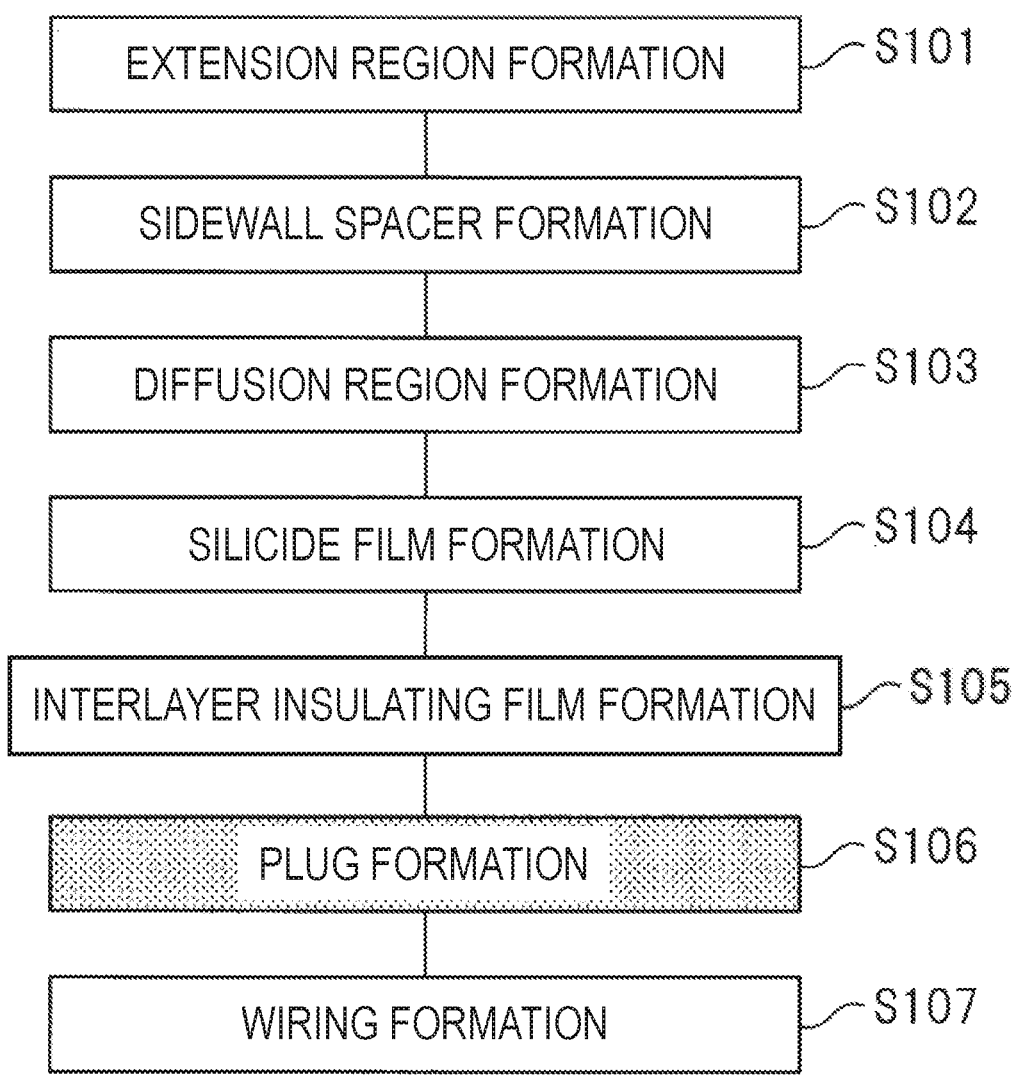
FIG. 23 is a flow chart showing the flow of the manufacturing process of the semiconductor device following FIG. 22.

Subsequently, as shown in FIG. 23, by introducing conductivity type impurities into the fins FA by using, for example, oblique ion implantation method, extension regions are formed in alignment with the gate electrodes GE1 (S101). Then, after an insulating film is deposited on the semiconductor substrate 1S, the insulating film is anisotropically etched to form sidewall spacers on both sidewalls of the gate electrodes GE1 (S102). Next, by introducing conductivity type impurities into the fins FA using, for example, oblique ion implantation method, diffusion regions are formed in alignment with the sidewall spacers (S103). Thereafter, silicide films are formed on, for example, the surfaces of the gate electrodes GE1 (S104). As described above, the field effect transistors of the "fin-structure" according to the first embodiment can be manufactured.

Next, an interlayer insulating film is formed (S105) to cover the field effect transistors of the "fin-structure" by using, for example, normal semiconductor manufacturing technique, and plugs are formed in the interlayer insulating film. Then, wirings are formed on the interlayer insulating film in which the plugs are formed. In this manner, a semiconductor device including field effect transistors of the "fin-structure" according to the first embodiment can be manufactured.

Features of Manufacturing Method in First Embodiment

Next, the feature of the manufacturing method in the first embodiment will be described.

The first feature in the manufacturing method according to the first embodiment is based on the assumption that, for example, as shown in FIGS. 18 to 20, a step of forming a resist pattern PR2 which is included in the element isolation trench DIT and surrounds the entire plurality of fins FA on the insulating film OXF2 is provided. As a result, for example, as shown in FIG. 20, the etching of the element isolation region STI is performed using the resist pattern PR2 as a mask, and therefore, as shown in FIG. 20, the entire element isolation region STI is not etched back, and a convex portion is formed on the element isolation region STI. In other words, the thickness of the silicon oxide film OXF2 decreases only in the region where the resist pattern PR2 is not formed, and the element isolation region STI having the narrow recess portion GV1 and the narrow recess portion GV2 is formed. At this time, the width of the recess portion GV1 is the distance P1 between the resist pattern PR2 and the fins FA, and the width of the recess portion GV2 is the distance P3 between the resist pattern PR2 and the element isolation trench DIT.

The first feature in the manufacturing method according to the first embodiment is that, for example, in FIG. 18, the distance P1 between the resist pattern PR2 and the fins FA is equal to or less than the distance P2 between the fins FA adjacent to each other. As a result, the width of the recess portion GV1 is equal to or less than the distance P2 between the fins FA adjacent to each other. At this time, the distance P2 between the fins FA adjacent to each other is designed so that the polysilicon film PF1 can be embedded in the space between the fins FA adjacent to each other while ensuring the flatness of the polysilicon film PF1. Therefore, as shown in FIG. 21, the polysilicon film PF1 can be embedded in the recess portion GV1 having width equal to or less than the distance P2 between the fins FA adjacent to each other while ensuring the flatness of the polysilicon film PF1. Therefore, according to the first feature in the manufacturing method according to the first embodiment, when forming the polysilicon film PF1, it is possible to embed the narrow recess portion GV1 by the polysilicon film PF1 without impairing the flatness of the surface of the polysilicon film PF1.

Similarly, the second feature in the manufacturing method according to the first embodiment is that, for example, in FIG. 18, the distance P3 between the resist pattern PR2 and the element isolation trench DIT is equal to or less than the distance P2 between the fins FA adjacent to each other. As a result, the widths of the recess portion GV2 are also equal to or less than the distances P2 between the fins FA adjacent to each other. Therefore, as shown in FIG. 21, the polysilicon film PF1 can be embedded in the recess portion GV2 having width equal to or less than the distance P2 between the fins FA adjacent to each other while ensuring the flatness of the polysilicon film PF1. Therefore, according to the second feature in the manufacturing method according to the first embodiment, when forming the polysilicon film PF1, it is possible to embed the narrow recess portion GV2 by the polysilicon film PF1 without impairing the flatness of the surface of the polysilicon film PF1.

Further, the third feature in the manufacturing method according to the first embodiment is that, for example, in FIG. 19, the distance P4 between the end portions of the plurality of fins FA in the X direction and the resist pattern PR2 is also equal to or less than the distance P2 between the fins FA adjacent to each other. As a result, by providing the third feature from the first feature in the manufacturing method according to the first embodiment, only the recess portion GV1 and the recess portion GV2 having widths equal to or less than the distance P2 (predetermined distance) between the fins FA adjacent to each other are formed in the element isolation region STI surrounding the "first region" in which the plurality of fins FA are formed. That is, according to the first embodiment, in the vicinity of the boundary region between the element isolation region STI and the "first region", only the recess portion GV1 embedded with the polysilicon film PF1 is formed while ensuring the flatness of the polysilicon film PF1, and in the vicinity of the outer edge region of the element isolation region STI, only the recess portion GV2 embedded with the polysilicon film PF1 is formed while ensuring the flatness of the polysilicon film PF1. Therefore, the flatness of the polysilicon film PF1 formed on the vicinity of the boundary region between the element isolation region STI and the "first region" or on the vicinity of the outer edge region of the element isolation region STI can be ensured. As a result, according to the first embodiment, a step which impairs the flatness of the polysilicon film is suppressed from being formed on the polysilicon film PF1, and as a result, generation of etching residues caused by the step is suppressed. Therefore, according to the first embodiment, it is possible to prevent short-circuiting between the gate electrodes due to the etching residues and re-attachment of peeled etching residues on the semiconductor substrate, so that it is possible to improve the reliability of the semiconductor device and the manufacturing yield of the semiconductor device.

Next, the fourth feature in the manufacturing method according to the first embodiment is that, for example, in FIG. 19, the distance P4 between the end portions of the plurality of fins FA in the X direction and the resist pattern PR2 is equal to or larger than the distance P5 between the gate electrodes GE1 adjacent to each other shown in FIG. 11. As a result, the width of the recess portion GV2 formed in the element isolation region STI is equal to or larger than the distance P5 between the gate electrodes GE1 adjacent to each other shown in FIG. 11. In this instance, in a step of forming the sidewall spacers on both sidewalls of the gate electrodes GE1, since the width of the recess portion GV2 is equal to or larger than the distance P5 between the gate electrodes GE1 adjacent to each other, it is possible to prevent the inside of the recess portion GV2 from being embedded with the insulating film formed for forming the sidewall spacers. Therefore, after the sidewall spacers are formed, the generation potential of foreign substance caused by peeling of the insulating film embedded in the recess portion GV2 can be reduced.

When the insulating film is embedded in the recess portion GV2 in a step of forming the sidewall spacers, the element isolation region STI and the fins FA are connected to each other via the insulating film embedded in the recess portion GV2 in the field effect transistor to be manufactured thereafter. In this case, there is a concern that the stress due to the difference in material between the element isolation region STI (silicon oxide) and the fin FA (silicon) is applied to the fin FA, thereby causing variation in the characteristics of the field effect transistor. In this regard, according to the fourth feature of the first embodiment, since the recess portion GV2 is not embedded with the insulating film constituting the sidewall spacers, it is possible to suppress the characteristic variation of the field effect transistor caused by the application of stresses to the fins FA.

Next, the fifth feature of the first embodiment is based on the assumption that, for example, in FIGS. 18 to 20, the silicon oxide film OXF2 embedded in the element isolation trench DIT is etched back by isotropic etching. The fifth feature in the first embodiment is that, for example, in FIG. 18, the distance P1 between the resist pattern PR2 and the fin FA is made smaller than the distance P2 between the fins FA adjacent to each other, and the distance P3 between the resist pattern PR2 and the element isolation trench DIT is also made smaller than the distance P2 between the fins FA adjacent to each other. Thus, even when the isotropic etching in which the side etching proceeds is used, the width of the recess portion GV1 and the width of the recess portion GV2 can be made equal to or less than the distance P2 between the fins FA adjacent to each other.

For example, when anisotropic etching typified by dry etching is used, as shown in FIG. 20, the silicon oxide film OXF2 formed in the region covered with the resist pattern PR2 is not side-etched. On the other hand, when isotropic etching such as wet etching is used, since side etching also occurs in the isotropic etching, a part of the silicon oxide film OXF formed in the region covered with the resist pattern PR2 is also etched by the side etching. In this instance, for example, when the distance P1 between the resist pattern PR2 and the fin FA is made equal to the distance P2 between the fins FA adjacent to each other, the width of the recess portion GV1 formed thereafter is larger than the distance P2 between the fins FA adjacent to each other due to the effect of the side etching. Similarly, for example, if the distance P3 between the resist pattern PR2 and the element isolation trench DIT is equal to the distance P2 between the fins FA adjacent to each other, the width of the recess portion GV2 formed thereafter is larger than the distance P2 between the fins FA adjacent to each other due to the effect of the side etching.

Therefore, in the first embodiment, when isotropic etching is used as a method of etching back the silicon oxide film embedded in the element isolation trench DIT, the effect of side etching is predicted in advance and margins are provided to the silicon oxide film. That is, when isotropic etch is used, in the first embodiment, the distance P1 between the resist pattern PR2 and the fin FA is made smaller than the distance P2 between the fins FA adjacent to each other, and the distance P3 between the resist pattern PR2 and the element isolation trench DIT is also made smaller than the distance P2 between the fins FA adjacent to each other. Thereby, it is possible to suppress that the width of the recess portion GV1 and the width of the recess portion GV2 are larger than the distance P2 between the fins FA adjacent to each other. As a result, according to the fifth feature in the manufacturing method according to the first embodiment, even when isotropic etching is used as a method of etching back the silicon oxide film embedded in the element isolation trench DIT, it is possible to suppress the formation of the recess portion GV1 and the recess portion GV2 having widths larger than the distance P2 between the fins FA adjacent to each other. That is, as a method of etching back the silicon oxide film embedded in the element isolation trench DIT, the polysilicon film PF1 for embedding the recess portion GV1 and the recess portion GV2 can be formed on the element isolation region STI from the "first region" while ensuring the flatness of the polysilicon film PF1 in either the case of using anisotropic etching or the case of using isotropic etching. Therefore, the fifth feature of the first embodiment is not affected by the method of etching back the silicon oxide film embedded in the element isolation trench DIT, and is useful from the viewpoint of reliably ensuring the flatness of the polysilicon film PF1 formed on the vicinity of the boundary region between the element isolation region STI and the "first region" or on the vicinity of the outer edge region of the element isolation region STI.

Features of Structure in First Embodiment

Next, features of structure according to the first embodiment will be described.

Figure 24:
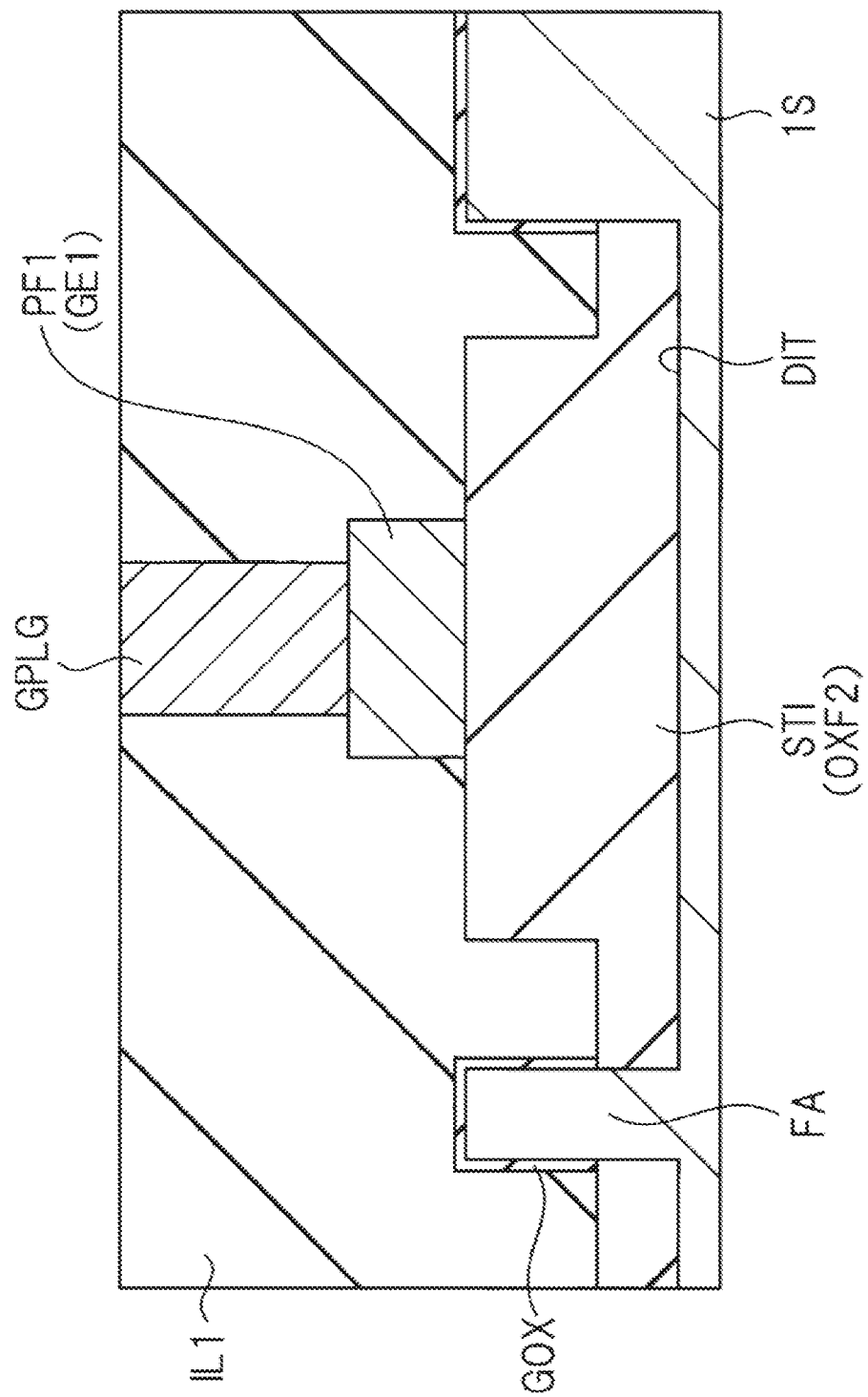
FIG. 24 is a cross-sectional view cut along line B-B in FIG. 11.

FIG. 24 is a cross-sectional view cut along line B-B in FIG. 11. In particular, FIG. 24 is a diagram schematically showing a connection structure between the gate electrode GE1 and the gate plug GPLG in a power supply region in which the gate electrode GE1 and the gate plug GPLG are connected shown in FIG. 11.

In FIG. 24, the structural feature according to the first embodiment is that, for example, in the manufacturing method of the semiconductor device, as a result of adopting at least the third feature from the first feature in the manufacturing method described above, a convex shaped element isolation region STI is formed. As a result, as shown in FIG. 24, the polysilicon film PF1 constituting the gate electrode GE1 is arranged on the convex shaped element isolation region STI, and the gate plug GPLG penetrating the interlayer insulating film IL1 is connected to the gate electrode GE1 formed of the polysilicon film PF1. At this time, according to the structural feature according to the first embodiment in which the element isolation region STI has a convex shape, the depth of the gate plug GPLG formed in the interlayer insulating film IL1 can be reduced as shown in FIG. 24. In other words, according to the structural feature according to the first embodiment in which the element isolation region STI has a convex shape, as shown in FIG. 24, the aspect ratio (depth/width) of the gate plug GPLG connected to the polysilicon film PF1 constituting the gate electrode GE1 can be reduced. This means that the easiness of manufacturing the gate plug GPLG can be improved. That is, the fact that the aspect ratio of the gate plug GPLG can be reduced means that the embedding characteristic of a conductive film in a contact hole can be improved, thereby suppressing the generation of voids in the gate plug GPLG. That is, according to the structural feature according to the first embodiment in which the element isolation region STI has a convex shape, the aspect ratio of the gate plug GPLG connected to the gate electrode GE1 can be reduced, resulting in remarkable effects that the gate plug GPLG can be manufactured easily and the reliability of the gate plug GPLG can be improved.

Figure 25:
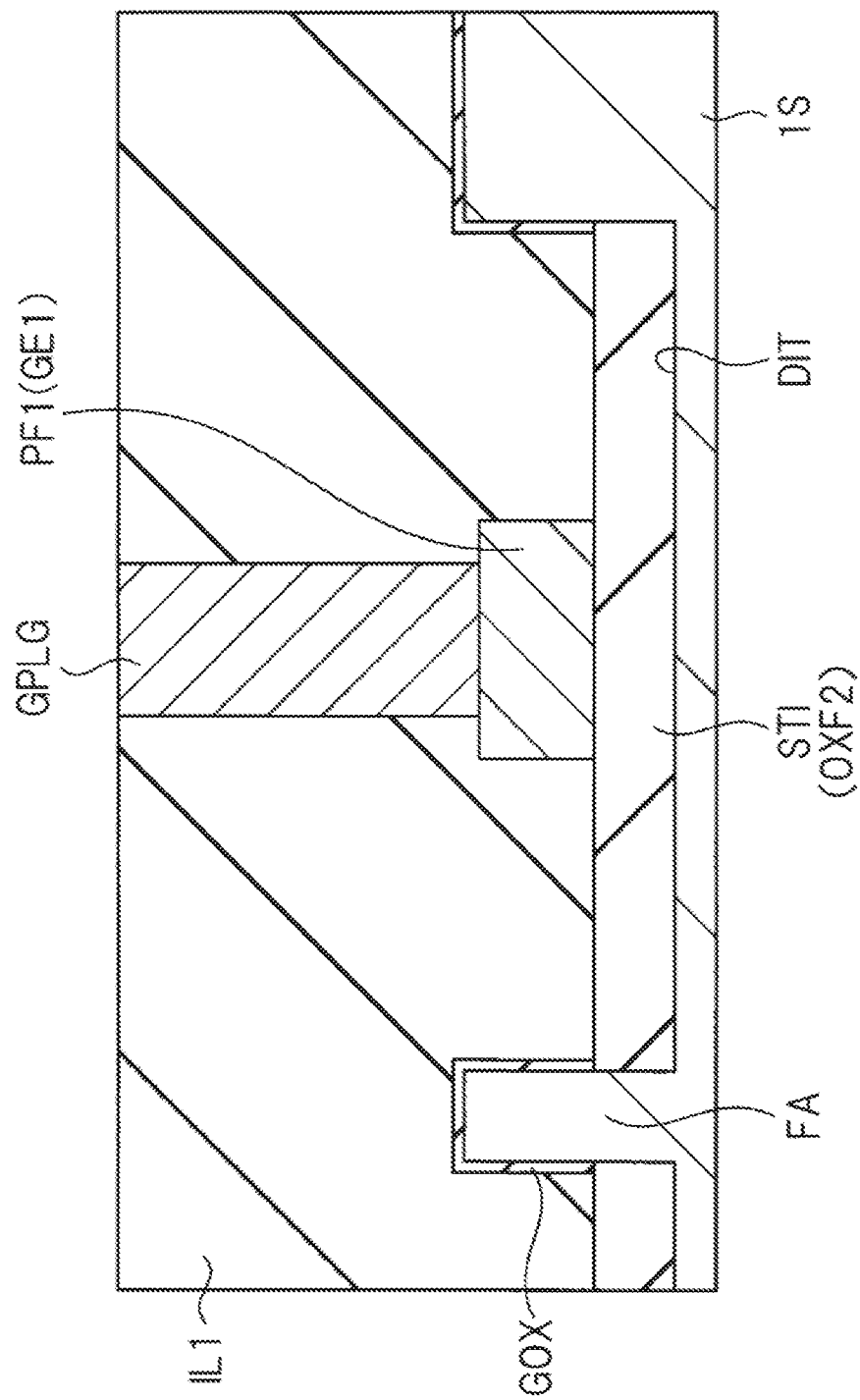
FIG. 25 is a diagram showing a connection structure of a gate electrode and a gate plug when the element isolation region is formed by etching back the silicon oxide film embedded in the element isolation trench without using the resist pattern.

For example, FIG. 25 is a diagram showing a connection structure between the gate electrode GE1 and the gate plug GPLG when the element isolation region STI is formed by etching back the silicon oxide film OXF2 embedded in the element isolation trench DIT without using the resist pattern PR2.

In FIG. 25, the element isolation region STI having a convex shape as shown in FIG. 24 is not formed, and the etched back flat element isolation region STI is formed. As a result, as shown in FIG. 25, the aspect ratio of the gate plug GPLG connected to the polysilicon film PF1 formed on the etched back flat element isolation region STI increases. This means that the easiness of manufacturing the gate plug GPLG is lowered. This is because the fact that the aspect ratio of the gate plug GPLG is large means that the embedding characteristic of the conductive film in the contact hole is deteriorated, thereby increasing the possibility that voids are generated in the gate plug GPLG. That is, as shown in FIG. 25, in the etched back flat element isolation region STI, the gate plug GPLG connected to the gate electrode GE1 has a high aspect ratio, and as a result, it is difficult to improve the manufacture of the gate plug GPLG and the reliability of the gate plug GPLG.

On the other hand, according to the semiconductor device according to the first embodiment having the structural feature that the element isolation region STI shown in FIG. 24 has a convex shape, the aspect ratio of the gate plug GPLG connected to the polysilicon film PF1 formed on the element isolation region STI can be reduced. Therefore, according to the semiconductor device according to the first embodiment, it is possible to improve the reliability of the gate plug GPLG electrically connected to the gate electrode GE1 of the field effect transistor PF1.

Second Embodiment

In the first embodiment, the technical idea according to the first embodiment has been explained by exemplifying a field effect transistor of the "fin-structure". On the other hand, in the second embodiment, a semiconductor device including a nonvolatile memory cell of the "fin-structure" formed in a memory array forming region and a field effect transistor having a "fin-structure" formed in a peripheral circuit forming region will be described in which the technical idea of the first embodiment is applied.

Layout Configuration of Semiconductor Chip

A semiconductor device having a nonvolatile memory according to the second embodiment will be described.

First, a layout configuration of a semiconductor device (semiconductor chip) in which a system including a nonvolatile memory is formed will be described.

Figure 26:
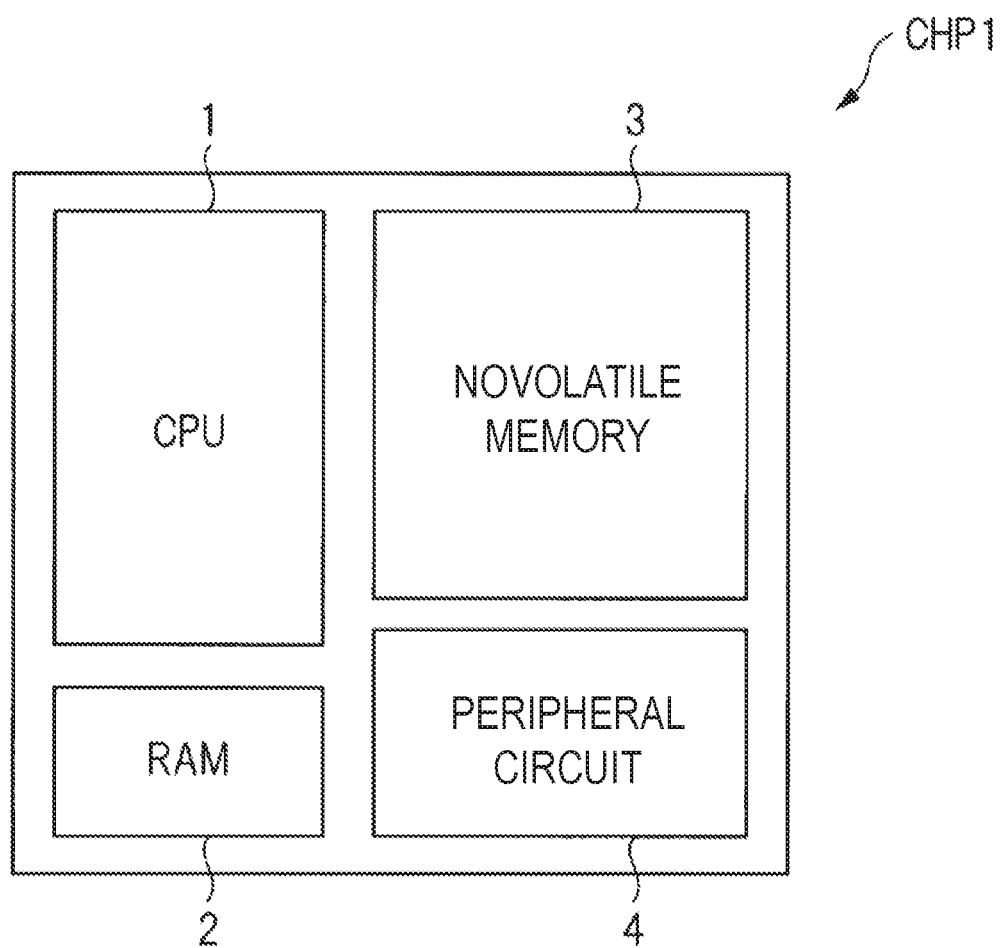
FIG. 26 is a diagram showing an exemplary layout configuration of a semiconductor chip according to second embodiment.

FIG. 26 is a diagram showing an exemplary layout configuration of the semiconductor chip CHP1 in the second embodiment. The semiconductor chip CHP1 includes a Central Processing Unit (CPU) 1, a Random Access Memory (RAM) 2, a nonvolatile memory 3, and a peripheral circuit 4.

The CPU (circuit) 1 is also called a central processing unit device, and corresponds to a heart portion of a computer or the like. The CPU 1 reads and decodes commands from storage devices, and performs various operations and controls based on the commands.

The RAM (circuit) 2 is a memory capable of randomly reading stored information, that is, reading stored information stored at any time, or newly writing stored information, and is also called a memory capable of writing and reading stored information at any time. There are two types of RAMs as IC memories: DRAM (Dynamic RAM) using dynamic circuits and SRAM (Static RAM) using static circuits. The DRAM is an arbitrary write/read memory that requires a storage holding operation, and the SRAM is an arbitrary write/read memory that does not require a storage holding operation.

The nonvolatile memory 3 is formed of, for example, EEPROM (Electrically Erasable Programmable Read Only Memory) or flash memory. EEPROM and flash memory are types of electrically rewritable nonvolatile memory for both write and erase operations and are also referred to as electrically erasable programmable read only memories. The memory cells of the EEPROM and the flash memory are formed of, for example, MONOS (Metal Oxide Nitride Oxide Semiconductor) type transistors or MNOS (Metal Nitride Oxide Semiconductor) type transistors for storage (memory). For example, Fowler-Nordheim tunneling is used for the write operation and the erase operation of the EEPROM and the flash memory. Note that it is also possible to perform the write operation or the erase operation using hot electrons or hot holes. The difference between the EEPROM and the flash memory is that the EEPROM is, for example, a nonvolatile memory which can be erased in units of bytes, whereas the flash memory is, for example, a nonvolatile memory which can be erased in units of word lines. Generally, the flash memory stores programs and the like for executing various processes in the CPU1. On the other hand, the EEPROM stores various types of data that are frequently rewritten.

The peripheral circuit 4 is a circuit group used in combination with the CPU1 and the RAM2, and is a circuit group that enriches the functions of the systems. The peripheral circuit 4 is formed of, for example, a digital circuit or an analog circuit. A digital circuit is a circuit that realizes logical operation, mutual conversion, transmission, storage, and the like of an electrical signal (digital signal) represented digitally. On the other hand, the analog circuit is a circuit that handles signals of voltages and currents that continuously change in time, that is, analog signals, and is formed of, for example, an amplifier circuit, a conversion circuit, a modulation circuit, an oscillation circuit, a power supply circuit, and the like.

Device Structure of Nonvolatile Memory

Next, the structure of the nonvolatile memory according to the second embodiment will be described.

The nonvolatile memory according to the second embodiment has a memory array forming region in which a plurality of memory cells are formed, a memory shunt region in which a power supply portion for supplying power to the memory cells is formed, and a region in which input/output control circuits such as word lines, bit lines, decoders, sense amplifiers, and the like are formed. In particular, a device structure of a memory cell formed in a memory array forming region will be described below.

Figure 27:
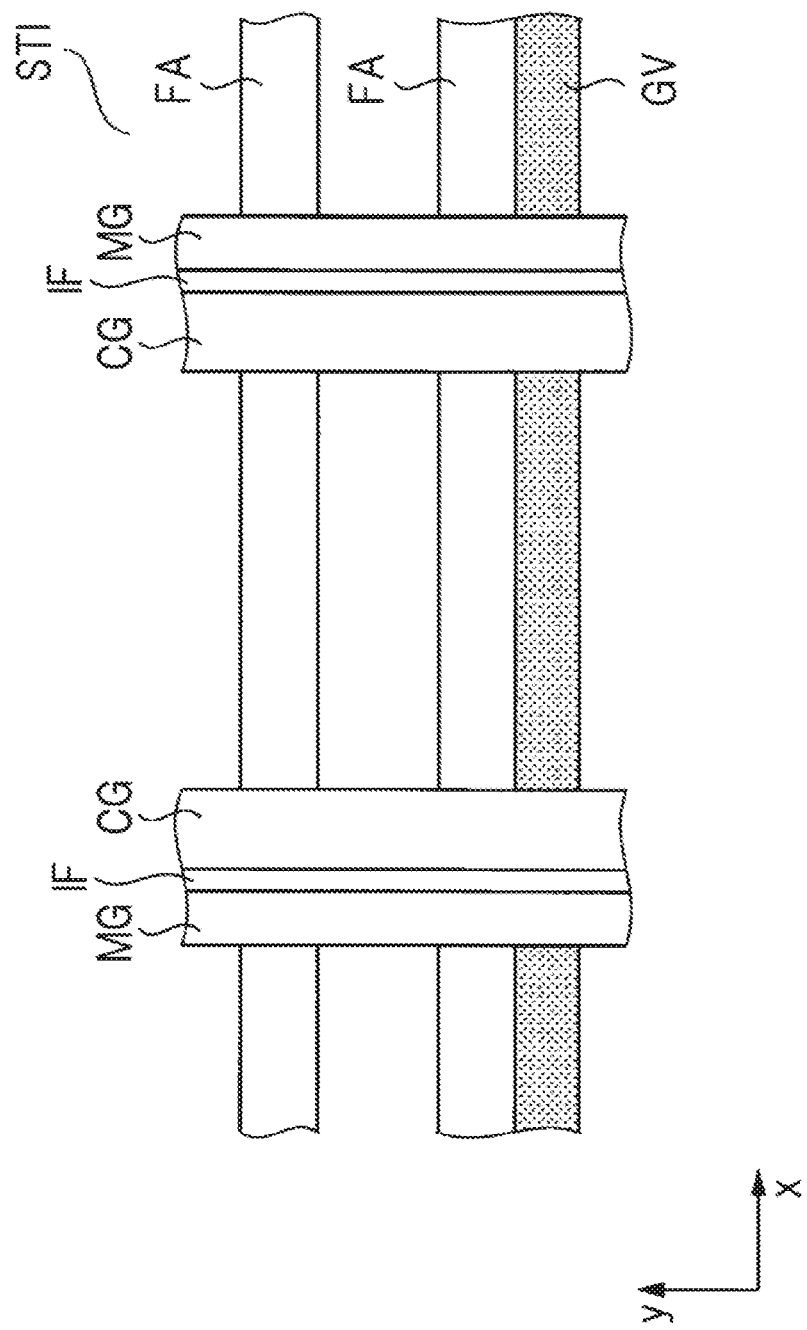
FIG. 27 is a plan view showing a part of a layout configuration of a memory array forming region in which a plurality of memory cells are formed.

FIG. 27 is a plan view showing a part of a layout configuration of a memory array forming region in which a plurality of memory cells are formed.

As shown in FIG. 27, in plan view, a plurality of fins FA extending in a X direction are arranged on the semiconductor substrate at equal intervals in a Y direction. The X direction and the Y direction are directions along a main surface of the semiconductor substrate, and the X direction and the Y direction are perpendicular to each other. A length of the fin FA in the X direction is longer than a length of the fin FA in the Y direction. That is, the X direction is the long side direction of the fin FA, and the Y direction is the short side direction of the fin FA. The fins FA are parts of the semiconductor substrate and are protruding portions of rectangular parallelepiped that selectively protrude from the upper surface of the semiconductor substrate.

Element isolation regions STI are formed on the main surface of the semiconductor substrate between the plurality of fins FA. A position of the upper surface of the element isolation region STI is lower than a position of the upper surface of the fin FA. In other words, a part of the fin FA is a semiconductor layer protruding from the element isolation portion STI, and the other part of the fin FA is positioned so as to be sandwiched between the element isolation regions STI in the Y direction. As described above, the upper portion of each of the plurality of fins FA is insulated and isolated by the element isolation region STI. In the second embodiment, a portion of the fin FA located at a position higher than the upper surface of the element isolation region STI may be referred to as an upper portion of the fin FA, and a portion of the fin FA located at a position lower than the upper surface of the element isolation region STI may be referred to as a lower portion of the fin FA.

In FIG. 27, in the memory array forming region in which a plurality of memory cells are formed in the second embodiment, a recess portion GV is formed so as to be in contact with the fin FA of the outermost periphery.

As shown in FIG. 27, control gate electrodes CG extending in the Y direction are arranged at equal intervals in the X direction so as to intersect the plurality of fins FA. A stacked insulating film IF is formed on one sidewall of the control gate electrode CG, and a memory gate electrode MG is formed via the stacked insulating film IF. Memory gate electrodes MG extend in the Y direction and are arranged side by side in the X direction.

In the memory array forming region configured as described above, a memory cell is formed in an intersection region between the fin FA and the control gate electrode CG shown in FIG. 27. The memory cell of the "fin-structure" configured as described above is configured to include the fin FA, the control gate electrode CG, the stacked insulating film IF, and the memory gate electrode MG.

Figure 28:
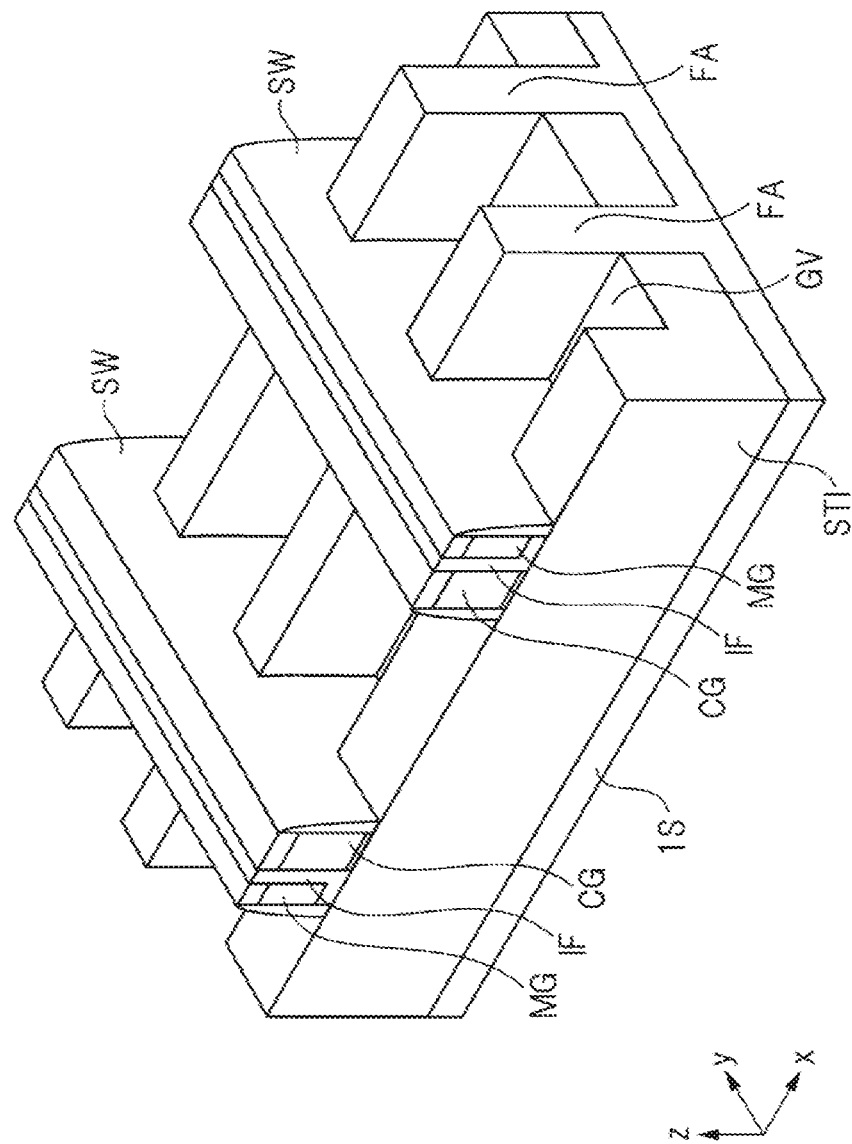
FIG. 28 is a perspective view schematically showing two memory cells of the "fin-structure".

FIG. 28 is a perspective view schematically showing two memory cells of the "fin-structure".

In FIG. 28, the memory cell of the "fin-structure" in the second embodiment has the fin FA formed on the semiconductor substrate 1S and extending in the X direction, and the control gate electrode CG straddling the fin FA and extending in the Y direction across the fin FA on which the gate dielectric film is formed. The memory cell of the "fin-structure" in the second embodiment has the stacked insulating film IF formed on a sidewall of the control gate electrode CG on one side, and the memory gate electrode MG formed on a sidewall of the control gate electrode CG on one side and extending in the Y direction via the stacked insulating film IF. Further, the memory cell of the "fin-structure" in the second embodiment has a sidewall spacer formed on the other side sidewall of the control gate electrode CG and a sidewall spacer formed on the other side sidewall of the memory gate electrode MG.

The stacked insulating film IF includes, for example, a first potential barrier film, a charge storage film formed on the first potential barrier film, and a second potential barrier film formed on the charge storage film. Here, for example, the first potential barrier film is formed of a silicon oxide film, the charge storage film is formed of an insulating film having a trapping levels typified by a silicon nitride film, and the second potential barrier film is formed of a silicon oxide film.

The control gate electrode CG is formed of, for example, a polysilicon film, and the memory gate electrode MG is also formed of a polysilicon film.

The element isolation region STI is formed so as to be in contact with the fin FA of the memory cell of the "fin-structure" in the second embodiment configured as described above, and the recess portion GV is formed in the element isolation region STI so as to be in contact with the fin FA of the outermost periphery. Here, the portion contributing to the data storage of the memory cell of the "fin-structure" in the second embodiment may be referred to as a memory transistor, and the portion contributing to the cell selection of the memory cell of the "fin-structure" in the second embodiment may be referred to as a select transistor. That is, the memory cell of the "fin-structure" in the second embodiment can be said to include a memory transistor including the memory gate electrode MG and the charge storage film, and a select transistor including the control gate electrode CG.

Although not shown in FIG. 28, a diffusion region (impurity region) serving as a drain region and a diffusion region (impurity region) serving as a source region are formed inside the fin FA in the memory cell of the "fin-structure" in the second embodiment.

Operation of Nonvolatile Memory

Next, the operation of the nonvolatile memory according to the second embodiment will be described.

Figure 29:
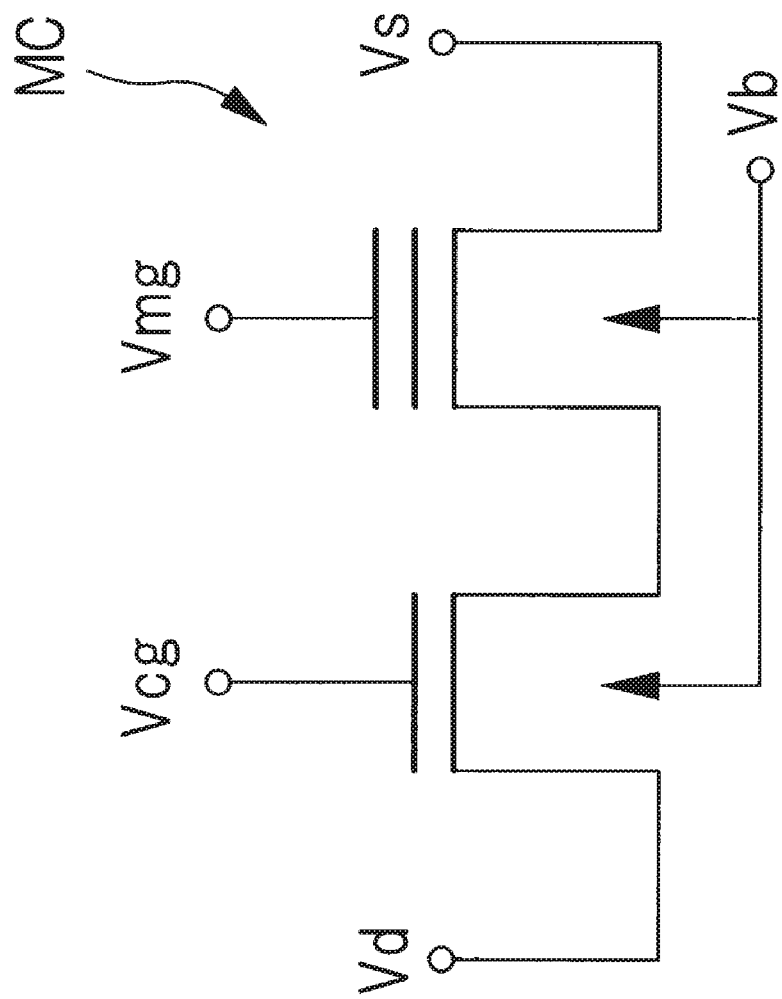
FIG. 29 is an equivalent circuit diagram showing a memory cell of the nonvolatile memory.

FIG. 29 is an equivalent circuit diagram showing the memory cell MC of the nonvolatile memory.

FIG. 30 is a table showing an example of the application conditions of the voltage to each portion of the selected memory cell MC at the time of "write", "erase" and "read".

In the table of FIG. 30, the voltage Vd applied to the drain region, the voltage Vcg applied to the control gate electrode CG, the voltage Vmg applied to the memory gate electrode MG, the voltage Vs applied to the source region, and the voltage Vb applied to the well region are described at the time of "write", "erase", and "read", respectively.

Note that what is shown in the table of FIG. 30 is a suitable example of a voltage application condition, and is not limited to this, and various changes can be made as necessary. In the second embodiment, injection of electrons into the charge storage film is defined as "write", and injection of holes into the charge storage film is defined as "erase".

The write operation is performed by a write method using hot electron injection by source side injection, which is referred to as Source Side Injection method. For example, write is performed by applying voltages as shown in the column of "write" in FIG. 30 to respective portions of the memory cell MC selected for write, and injecting electrons into the charge storage film of the selected memory cell MC.

At this time, hot electrons are generated in the portion of the fin FA covered with the memory gate electrode MG and the control gate electrode CG, and the hot electrons are injected into the charge storage film under the memory gate electrode MG. The injected hot electrons are captured by trapping levels in the charge storage film. As a result, the threshold voltage of the memory transistor having the memory gate electrode MG rises. That is, the memory transistor is in the write state.

The erase operation is performed by an erase method using hot hole injection by BTBT (Band-To-Band Tunneling), which is called BTBT method. That is, holes generated by the BTBT are injected into the charge storage film to perform erase. For example, voltages as shown in the column of "erase" in FIG. 30 are applied to respective portions of the memory cell MC selected to perform erase, holes are generated by BTBT phenomena, and holes are injected into the charge storage film of the selected memory cell MC by accelerating the electric field. As a result, the threshold voltage of the memory transistor is lowered. That is, the memory transistor is in the erase state.

In the read operation, for example, a voltage as shown in the column of "read" in FIG. 30 is applied to each portion of the memory cell MC selected for read. By setting the voltage Vmg applied to the memory gate electrode MG at the time of read to a value between the threshold voltage of the memory transistor in the write state and the threshold voltage of the memory transistor in the erase state, it is possible to discriminate between the write state and the erase state.

Method for Manufacturing Semiconductor Device in Second Embodiment

Next, a method for manufacturing a semiconductor device in the second embodiment will be described.

Hereinafter, a configuration will be described in which a memory array forming region in which memory cells of the "fin-structure" is formed is surrounded by an element isolation region formed by embedding an insulating film in the element isolation trench, and in which a peripheral circuit forming region in which a field effect transistors of the "fin-structure" constituting a peripheral circuit is formed is present in an outer region of the element isolation trench constituting the element isolation region.

Figure 31:
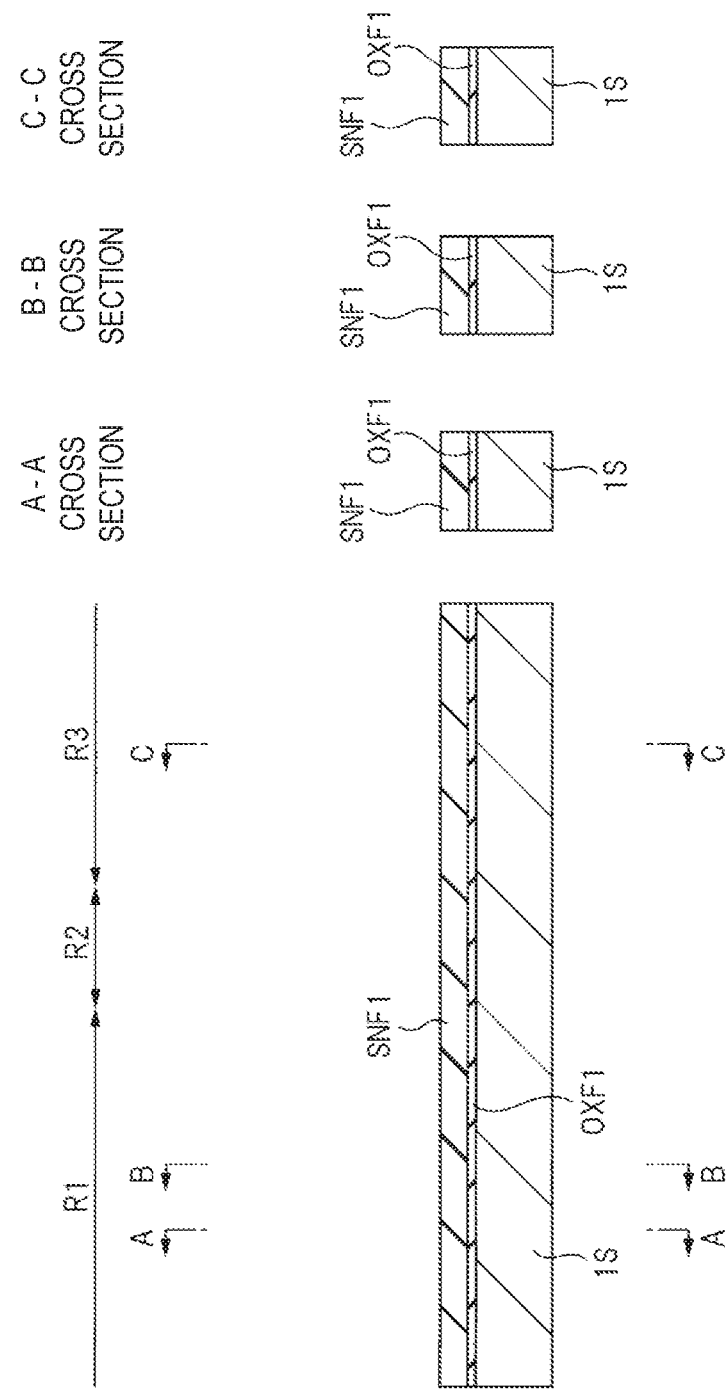
FIG. 31 is a cross-sectional view showing a manufacturing process of a semiconductor device according to second embodiment.

First, as shown in FIG. 31, a semiconductor substrate 1S is prepared. The semiconductor substrate 1S has a memory array forming region R1, a boundary region R2, and a peripheral circuit forming region R3, and the boundary region R2 is sandwiched between the memory array forming region R1 and the peripheral circuit forming region R3. In FIG. 31, not only the semiconductor substrate 1S in which the memory array formation region R1, the boundary region R2, and the peripheral circuit formation region R3 are shown, but also the A cross-section cut along the A line of the memory array formation region R1, the B cross-section cut along the B line of the memory array formation region R1, and the C cross-section cut along the C line of the peripheral circuit formation region R3 are shown side by side. The same regions as those in FIG. 31 are also shown in the drawings for explaining the subsequent manufacturing processes of the semiconductor device.

In FIG. 31, after a silicon oxide film OXF1 is formed on the semiconductor substrate 1S, a silicon nitride film SNF1 is formed on the silicon oxide film OXF1. The silicon oxide film OXF1 can be formed by using, for example, thermal oxidation method or Chemical Vapor Deposition (CVD) method, and the thickness of the silicon oxide film OXF1 is, for example, about 10 nm. The silicon nitride film SNF1 can be formed by using, for example, CVD method, and the thickness of the silicon nitride film SNF1 is, for example, about 100 nm.

Figure 32:
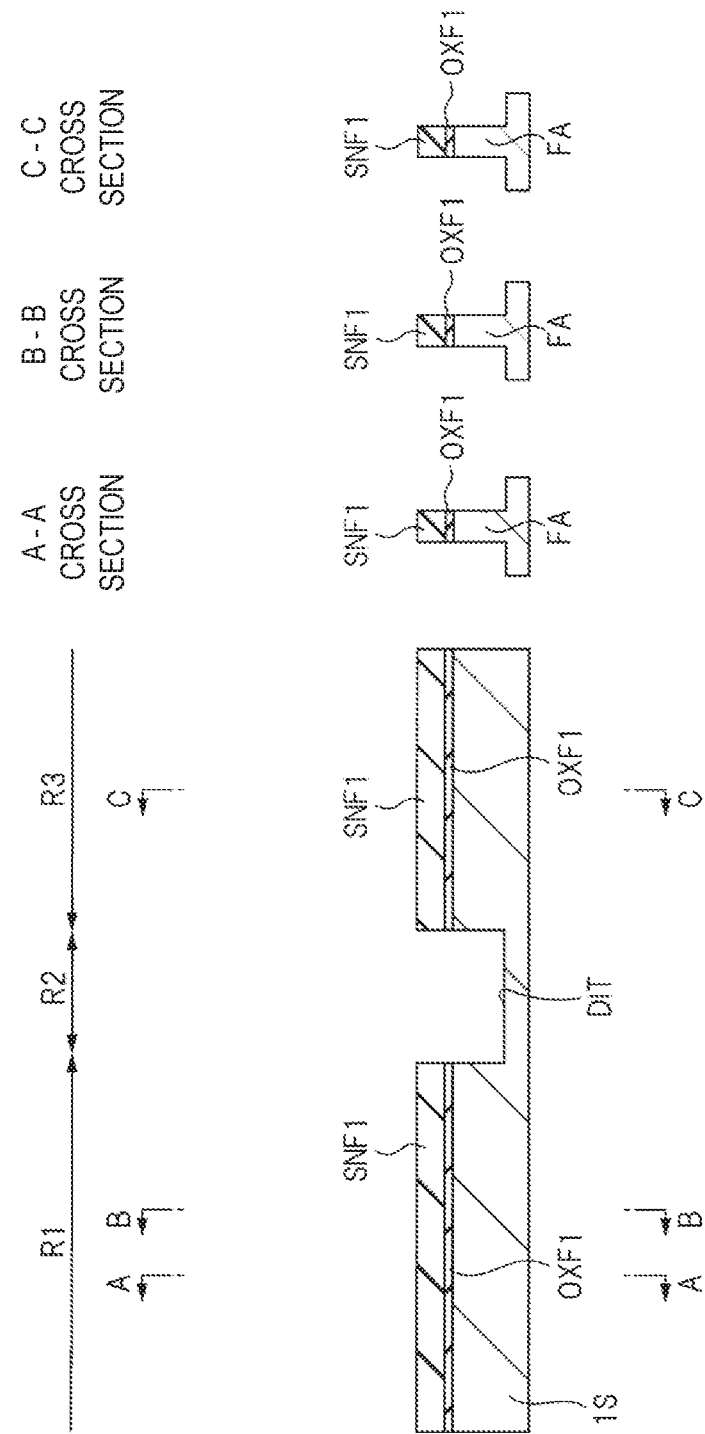
FIG. 32 is a cross-sectional view showing the manufacturing process of the semiconductor device following FIG. 31.
Figure 33:
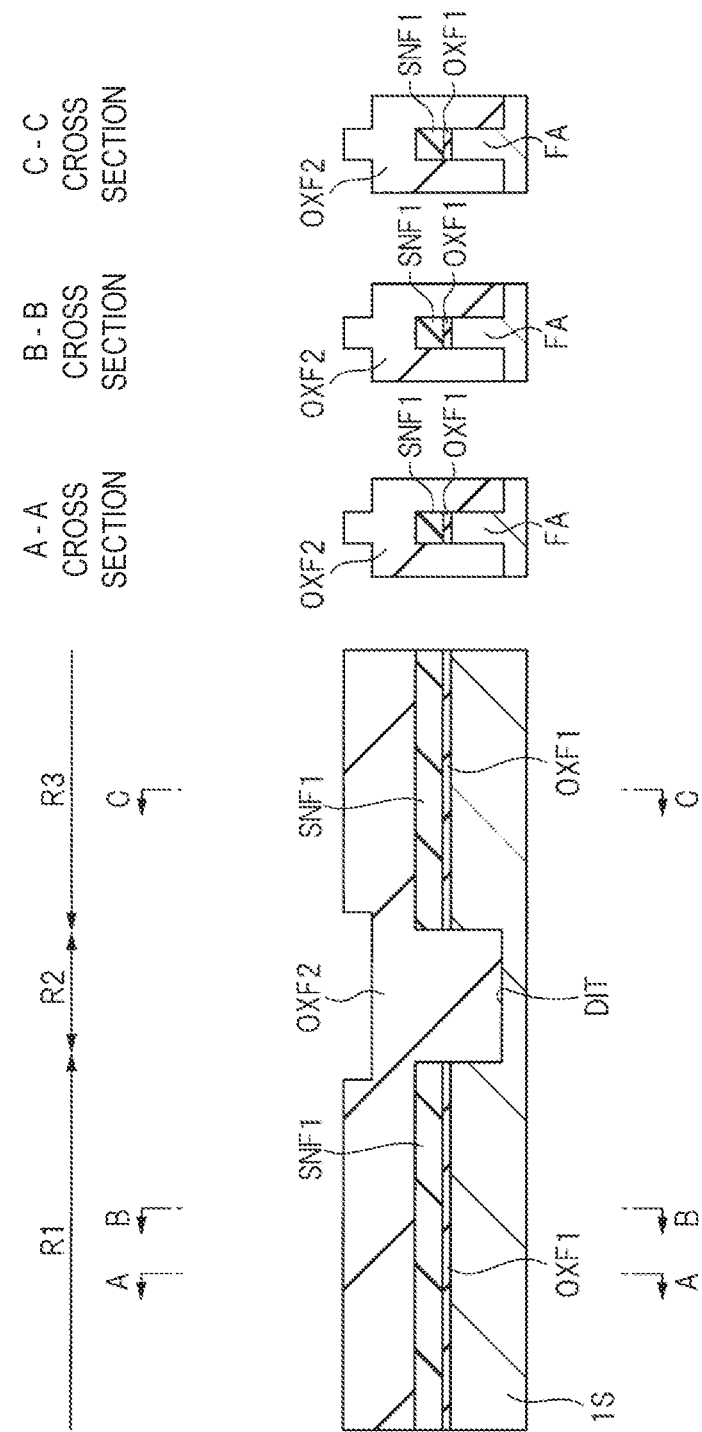
FIG. 33 is a cross-sectional view showing the manufacturing process of the semiconductor device following FIG. 32.

Subsequently, as shown in FIG. 32, the silicon nitride film SNF1 and the silicon oxide film OXF1 are patterned by using photolithography technique and etching technique, and the semiconductor substrate 1S is etched to about 400 nm to form the element isolation trench DIT. Thereafter, as shown in FIG. 33, a silicon oxide film OXF2 is formed over the stacked film of the patterned silicon oxide film OXF1 and the silicon nitride film SNF1 to embed inside of the element isolation trench DIT formed in the semiconductor substrate 1S. The silicon oxide film OXF2 can be formed by using, for example, CVD method, and the thickness of the silicon oxide film OXF2 is about 1000 nm (1 µm). In order to densify the silicon oxide film OXF2, annealing treatment (heat treatment) is performed on the semiconductor substrate 1S.

Figure 34:
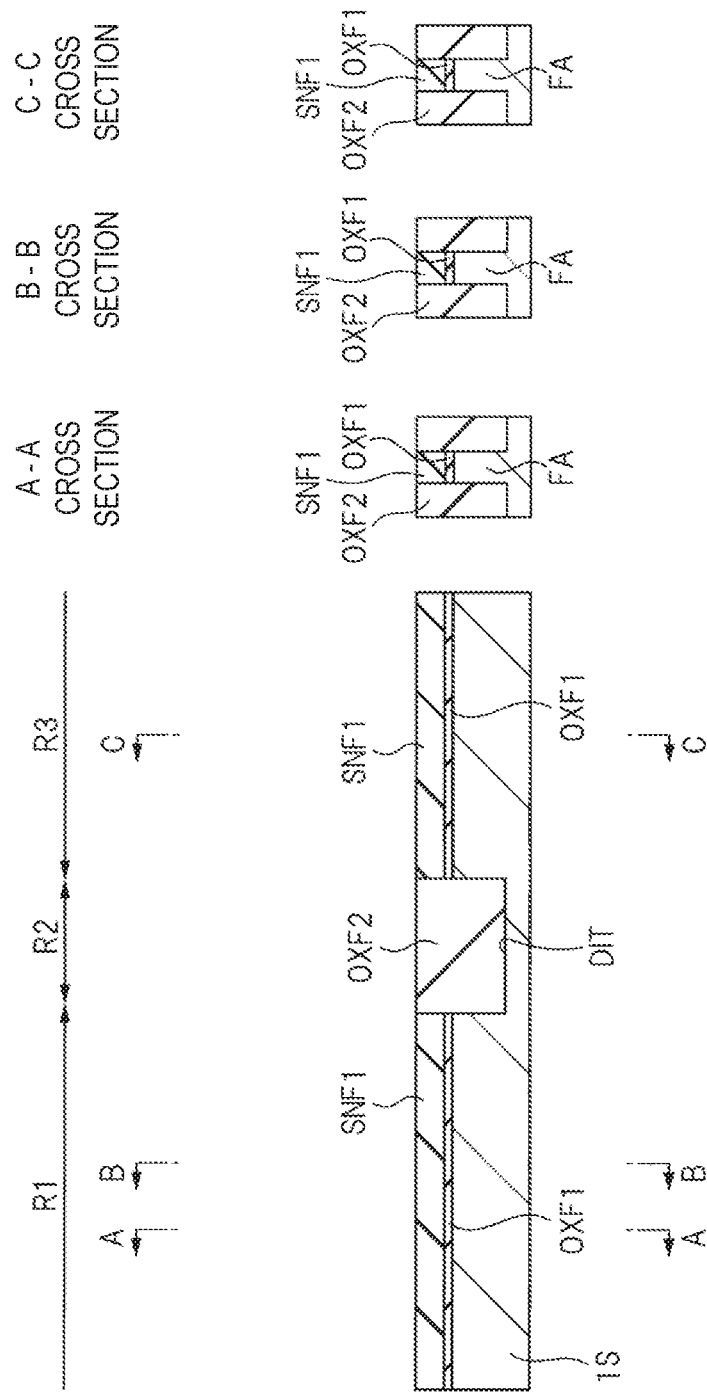
FIG. 34 is a cross-sectional view showing the manufacturing process of the semiconductor device following FIG. 33.

Next, as shown in FIG. 34, the surface of the silicon oxide film OXF2 is planarized by using, for example, Chemical Mechanical Polishing (CMP) method. As a result, as shown in FIG. 34, the surface of the silicon nitride film SNF1 are exposed.

Figure 35:
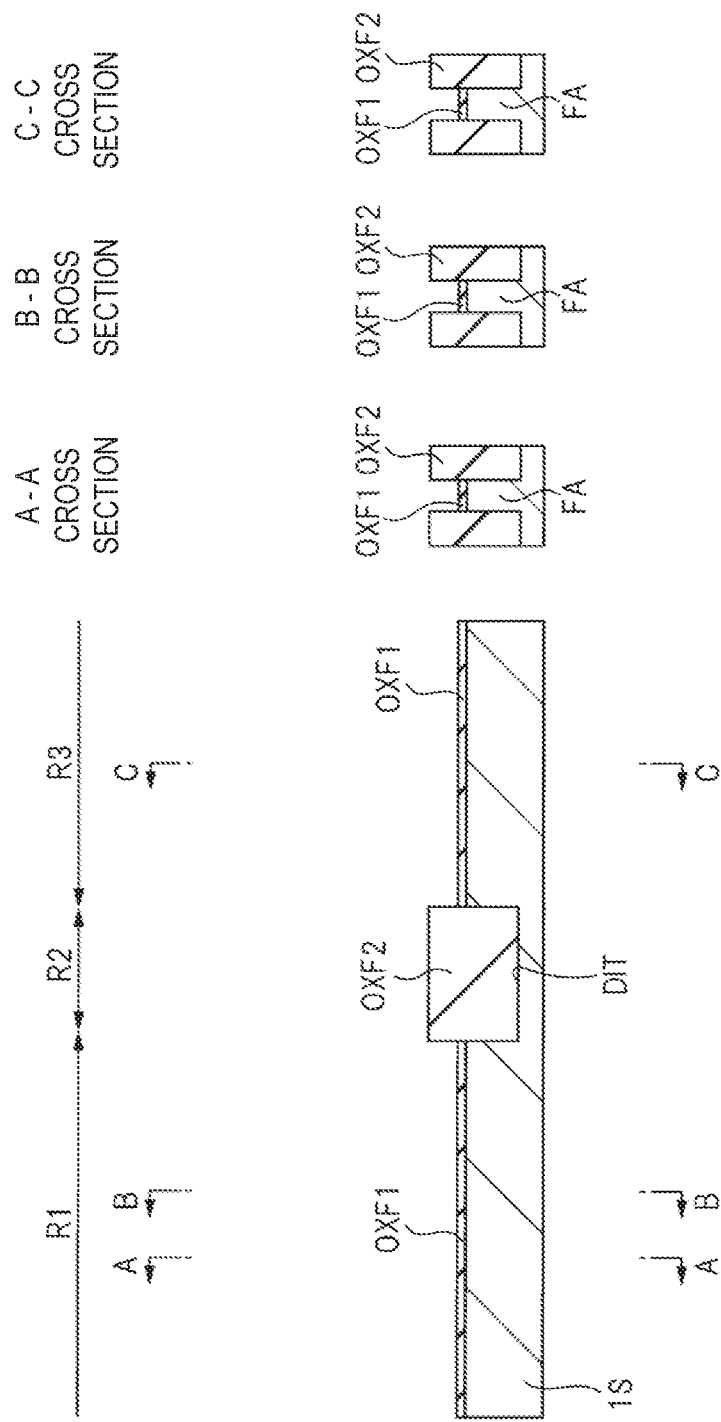
FIG. 35 is a cross-sectional view showing the manufacturing process of the semiconductor device following FIG. 34.

Then, as shown in FIG. 35, the exposed silicon nitride film SNF1 is removed. For example, hot phosphoric acid can be used to remove the silicon nitride film SNF1. Thereafter, the silicon oxide film OXF2 is etched so that the surface height of the silicon oxide film is equal to the surface height of the fins FA. Since the silicon oxide film OXF1 is also removed by this etching, the silicon oxide film OXF is subsequently formed on the fins FA.

Figure 36:
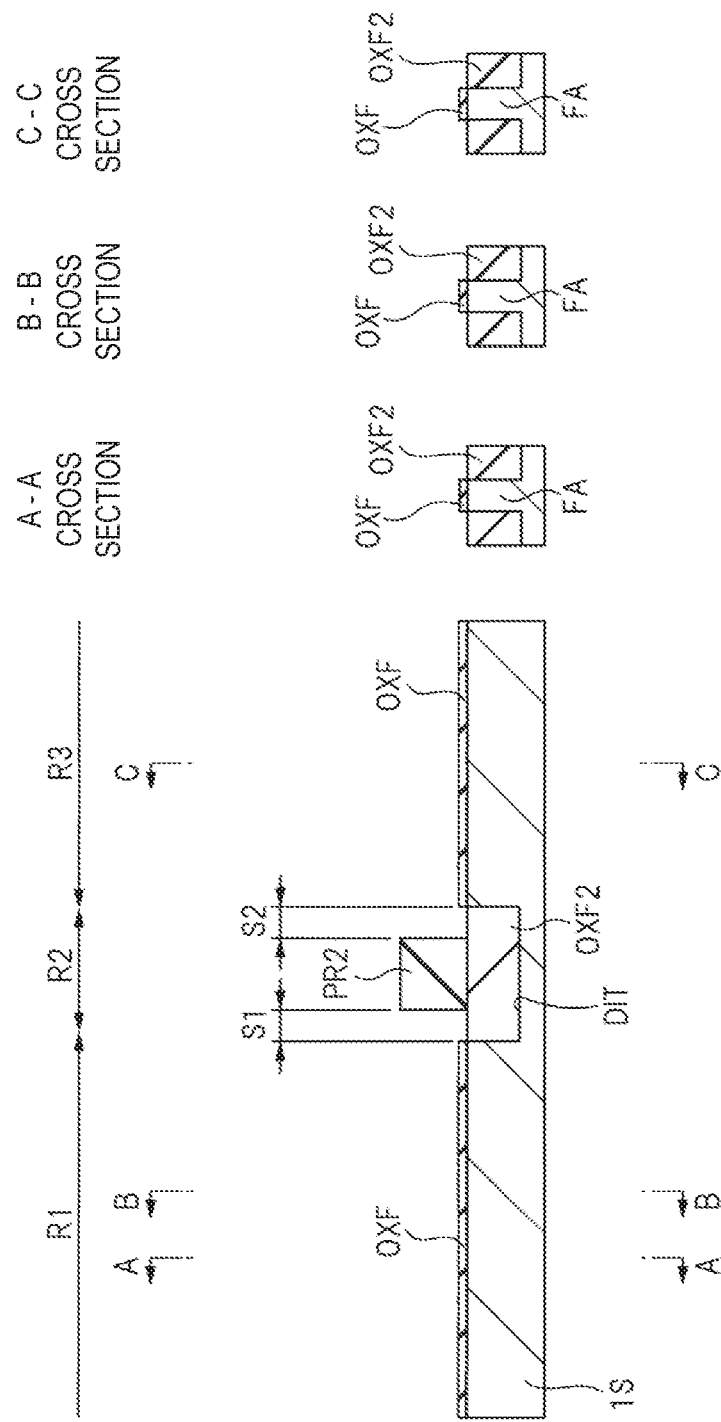
FIG. 36 is a cross-sectional view showing the manufacturing process of the semiconductor device following FIG. 35.

Subsequently, as shown in FIG. 36, a resist pattern PR2 partially covering the silicon oxide film OXF2 formed in the boundary region R2 is formed by using photolithography technique. Here, in FIG. 36, the distance between the left end of the resist pattern PR2 and the left end of the silicon oxide film OXF2 is the distance S1, and the distance between the right end of the resist pattern PR2 and the right end of the silicon oxide film OXF2 is the distance S2.

Figure 37:
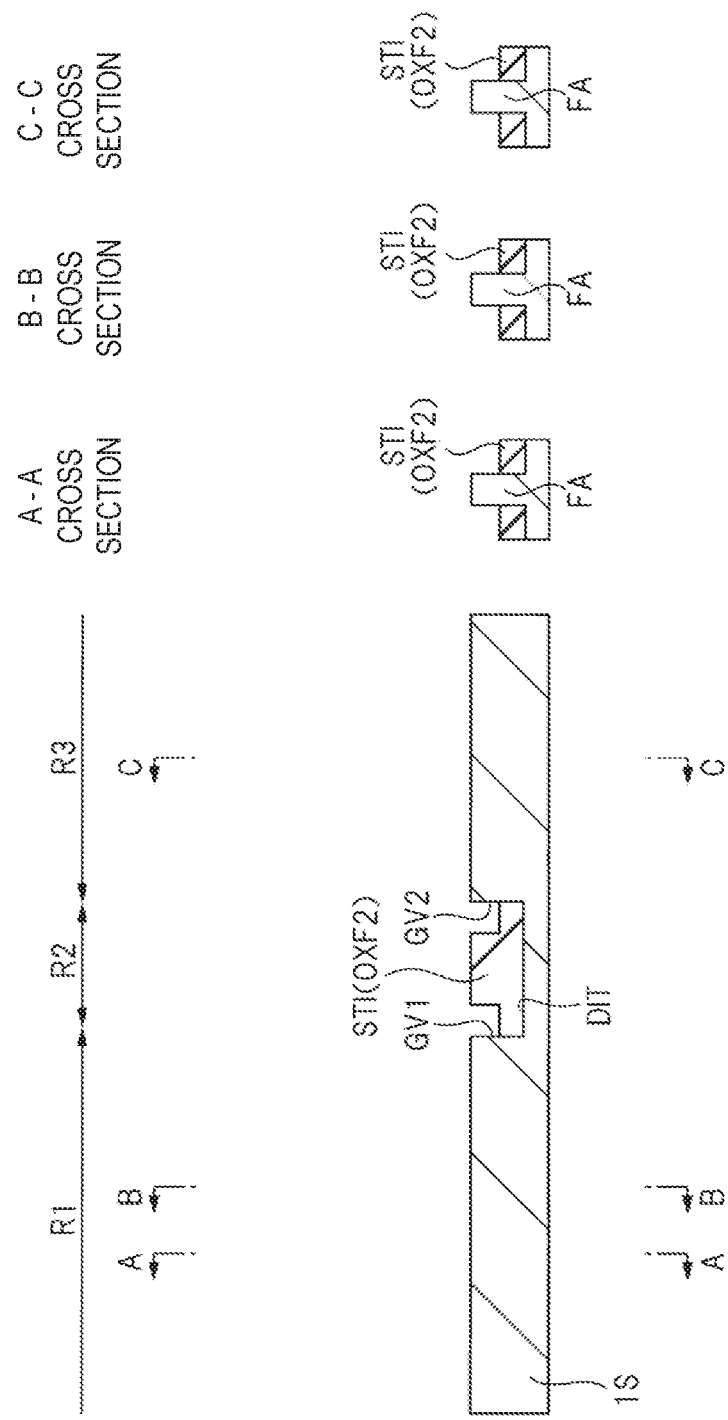
FIG. 37 is a cross-sectional view showing the manufacturing process of the semiconductor device following FIG. 36.

Subsequently, as shown in FIG. 37, the thickness of the silicon oxide film OXF2 exposed from the resist pattern PR2 is reduced by etching using the resist pattern PR2 as a mask. As a result, the element isolation region STI formed of the silicon oxide film OXF2 in which the recess portion GV1 and the recess portion GV2 are formed as shown in FIG. 37 can be formed in the boundary region R2. In this step, a plurality of fins FA can be formed in both regions of the memory array forming region R1 and the peripheral circuit forming region R3, as shown in the cross sections A, B, and C of FIG. 37. Here, the distance S1 and the distance S2 described above are equal to or less than the distance between the fins FA adjacent to each other.

Figure 38:
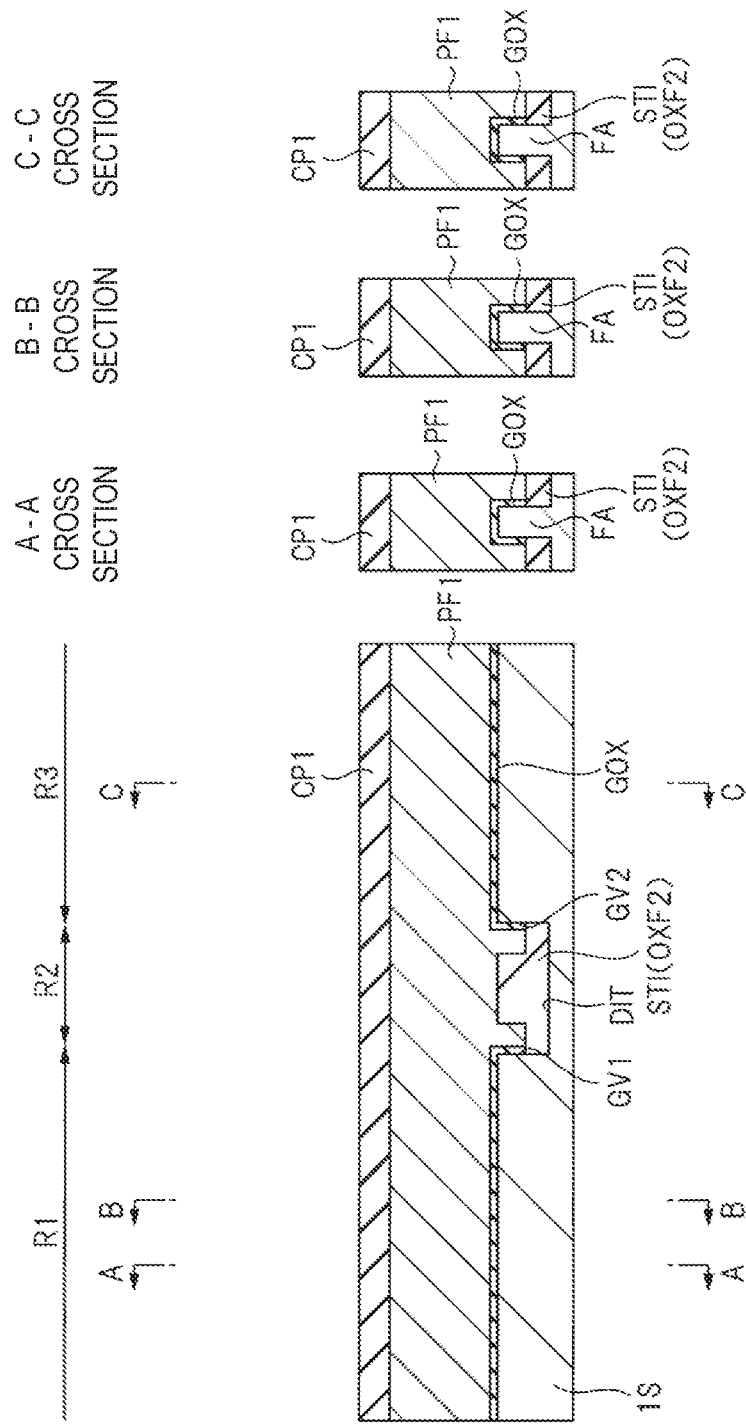
FIG. 38 is a cross-sectional view showing the manufacturing process of the semiconductor device following FIG. 37.

Next, as shown in FIG. 38, gate dielectric films GOX are formed on the surfaces of the fins FA. The gate dielectric film GOX is formed of, for example, a silicon oxide film, and can be formed by using, for example, thermal oxidation method. However, the gate dielectric film is not limited to the silicon oxide film, and may be formed of a metal oxide film typified by a hafnium oxide film, for example. The thickness of the gate dielectric film GOX is, for example, about 2 nm.

Then, a polysilicon film PF1 is formed so as to cover the upper surfaces and the side surfaces of the fins FA via the gate dielectric films GOX and to cover the element isolation region STI in which the recess portion GV1 and the recess portion GV2 are formed. In other words, the polysilicon film PF1 is formed so as to straddle the fins FA via the gate dielectric films GOX and cover the element isolation region STI. The polysilicon film PF1 can be formed by using, for example, CVD method, and the thickness of the polysilicon film PF1 is about 100 nm. Thereafter, a cap film CP1 is formed on the polysilicon film PF1. The cap film CP1 is formed of, for example, a silicon nitride film, and can be formed by using, for example, CVD method. The thickness of the cap film CP1 is, for example, about 80 nm.

At this time, the polysilicon film PF1 is embedded in the space between the plurality of fins FA while ensuring flatness of the polysilicon film PF1. That is, the space between the plurality of fins FA is designed so that the space between the fins FA adjacent to each other is embedded while ensuring the flatness of the surface of the polysilicon film PF1 covering the fins FA. In this regard, since the width of the recess portion GV1 (corresponding to the distance S1) and the width of the recess portion GV2 (corresponding to the distance S2) formed in the element isolation region STI are equal to or less than the distance between the fins FA adjacent to each other, both the recess portion GV1 and the recess portion GV2 are embedded with the polysilicon film PF1 while ensuring the flatness of the surface of the polysilicon film PF1. In other words, the polysilicon film PF1 is formed on the element isolation region STI without a step.

Figure 39:
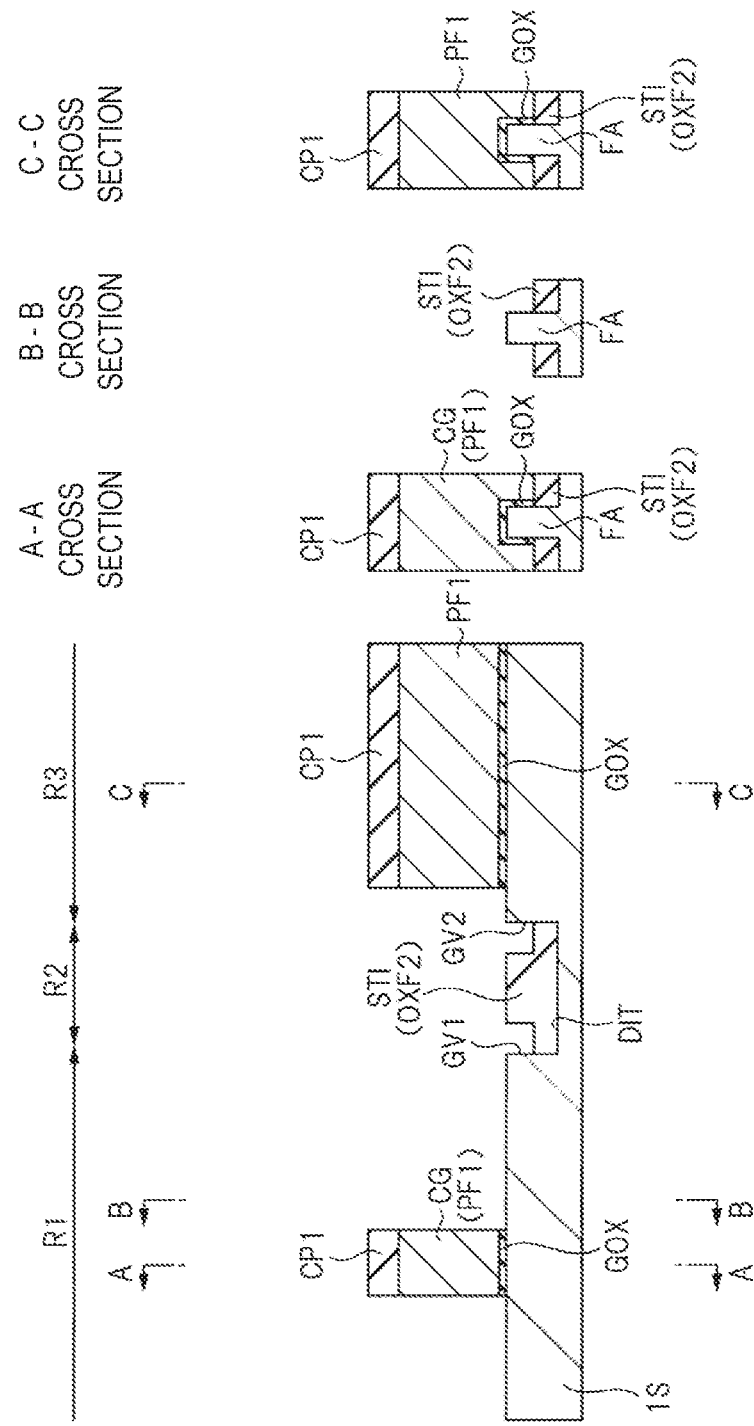
FIG. 39 is a cross-sectional view showing the manufacturing process of the semiconductor device following FIG. 38.

Subsequently, as shown in FIG. 39, the cap film CP1 and the polysilicon film PF1 are patterned by using photolithography technique and etching technique to form control gate electrodes CG formed of the polysilicon film PF1 and extending in the Y direction (see FIG. 27) in the memory array forming region R1.

Here, when the polysilicon film PF1 is etched, as a result of suppressing the formation of a step which impairs the flatness of the polysilicon film PF1, the generation of etching residues caused by the step is suppressed. Therefore, according to the method for manufacturing the semiconductor device according to the second embodiment, it is possible to prevent a short-circuit defect caused by etching residues or re-attachment of peeled etching residues on the semiconductor substrate 1S, and therefore, it is possible to improve the reliability of the semiconductor device and the manufacturing yield of the semiconductor device.

Figure 40:
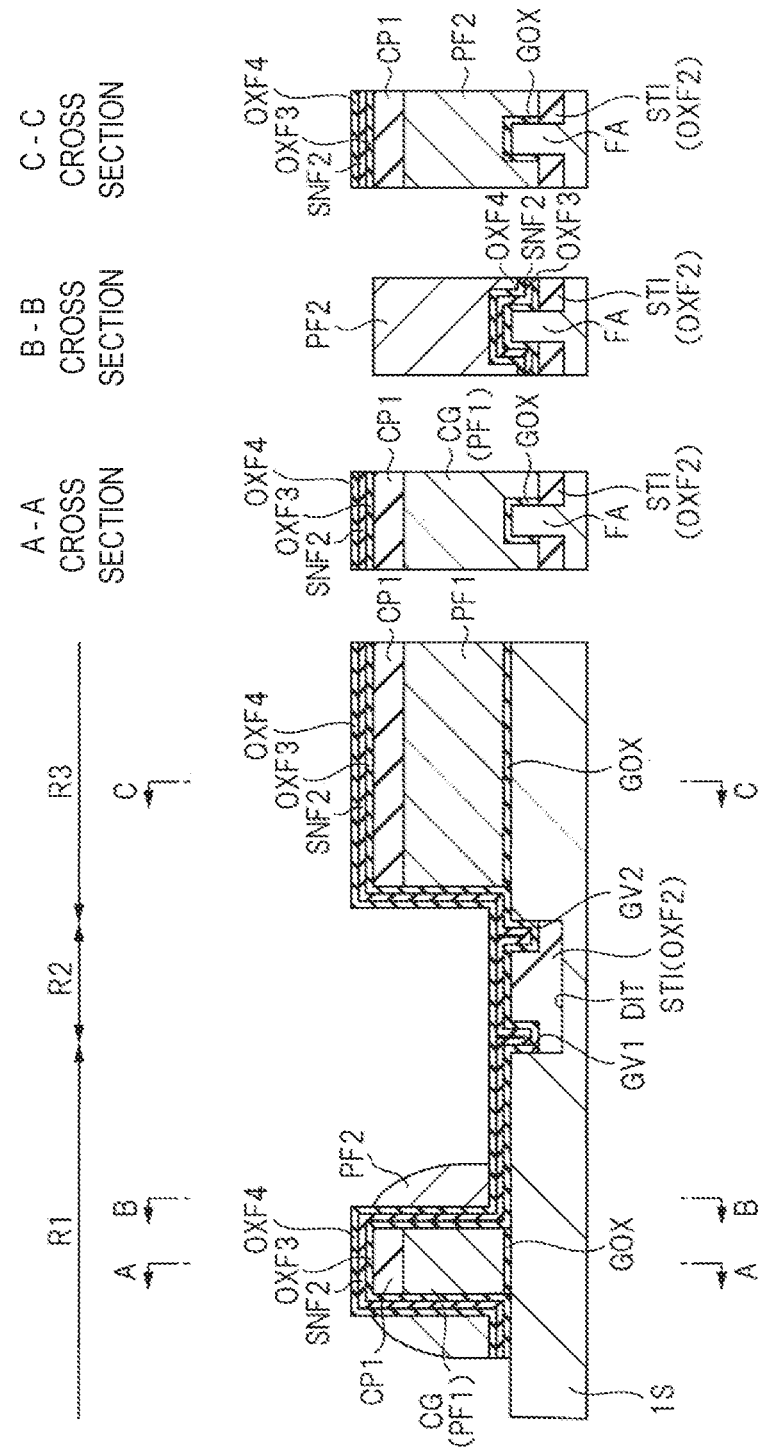
FIG. 40 is a cross-sectional view showing the manufacturing process of the semiconductor device following FIG. 39.

Next, as shown in FIG. 40, a stacked insulating film is formed so as to cover the control gate electrodes CG formed in the memory array forming region R1 and cover the cap film CP1 formed in the peripheral circuit formation region R3 from the element isolation region STI formed in the boundary region R2. Specifically, the stacked insulating film is formed of a silicon oxide film OXF3, a silicon nitride film SNF2 formed on the silicon oxide film OXF3, and a silicon oxide film OXF4 formed on the silicon nitride film SNF2. The silicon oxide film OXF3, the silicon nitride film SNF2, and the silicon oxide film OXF4 which constitute the stacked insulating film can be formed by, for example, CVD method. The silicon oxide film OXF3 serves as a first potential barrier film, the silicon nitride film SNF2 serves as a charge storage film, and the silicon oxide film OXF4 serves as a second potential barrier film.

Then, as shown in FIG. 40, a polysilicon film PF2 is formed on the stacked insulating film. The polysilicon film PF2 can be formed by using, for example, CVD method. Thereafter, the polysilicon film PF2 is anisotropically etched to form sidewall spacers formed of the polysilicon film PF2 on both sidewalls of the control gate electrode CG via the stacked insulating film.

Figure 41:
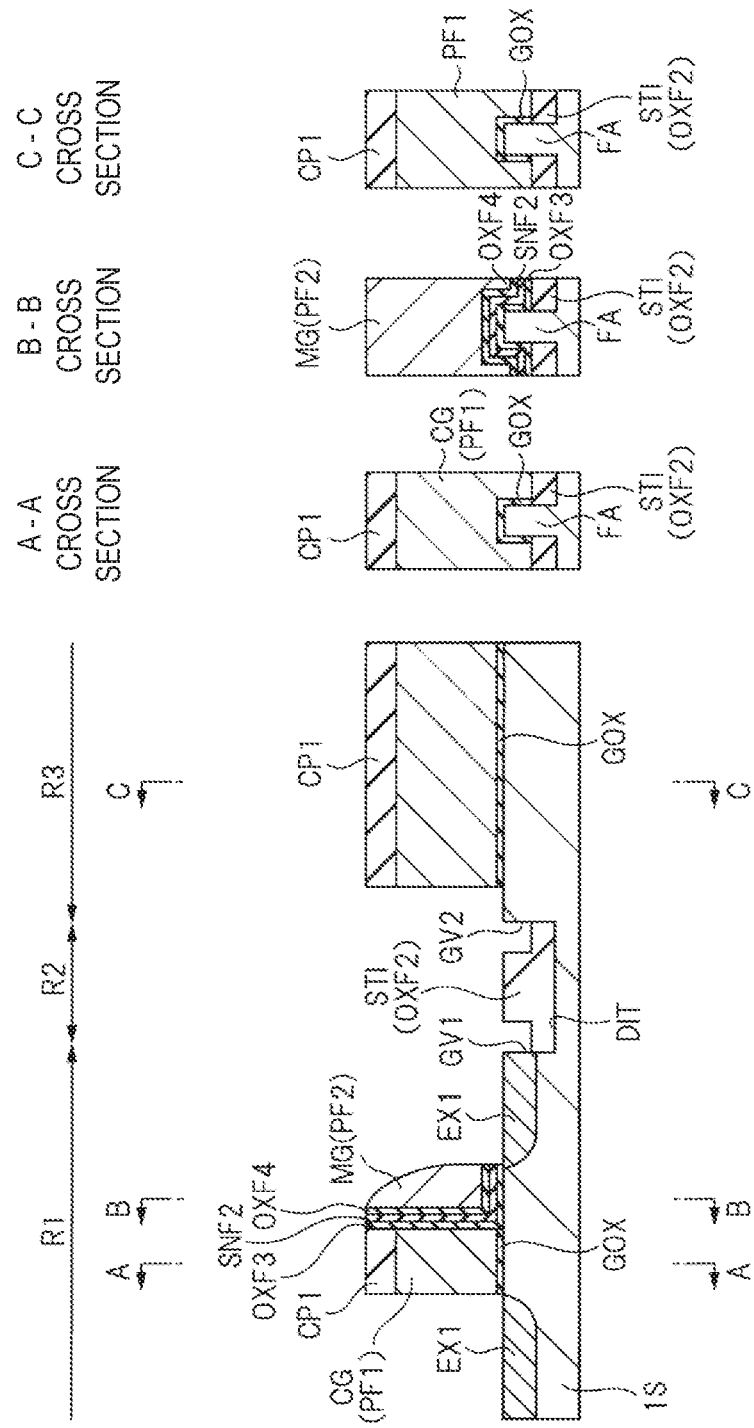
FIG. 41 is a cross-sectional view showing the manufacturing process of the semiconductor device following FIG. 40.

Subsequently, as shown in FIG. 41, the sidewall spacer formed on one sidewall of the control gate electrode CG is left, while the sidewall spacer formed on the other sidewall of the control gate electrode CG is removed. As a result, the memory gate electrode MG formed of the sidewall spacer can be formed on one sidewall of the control gate electrode CG. Thereafter, as shown in FIG. 41, by using photolithography technique and ion implantation method, conductivity type impurities are introduced into the fins FA to form extension regions EX1. The extension regions EX1 are formed in alignment with the control gate electrode CG and the memory gate electrode MG.

Figure 42:
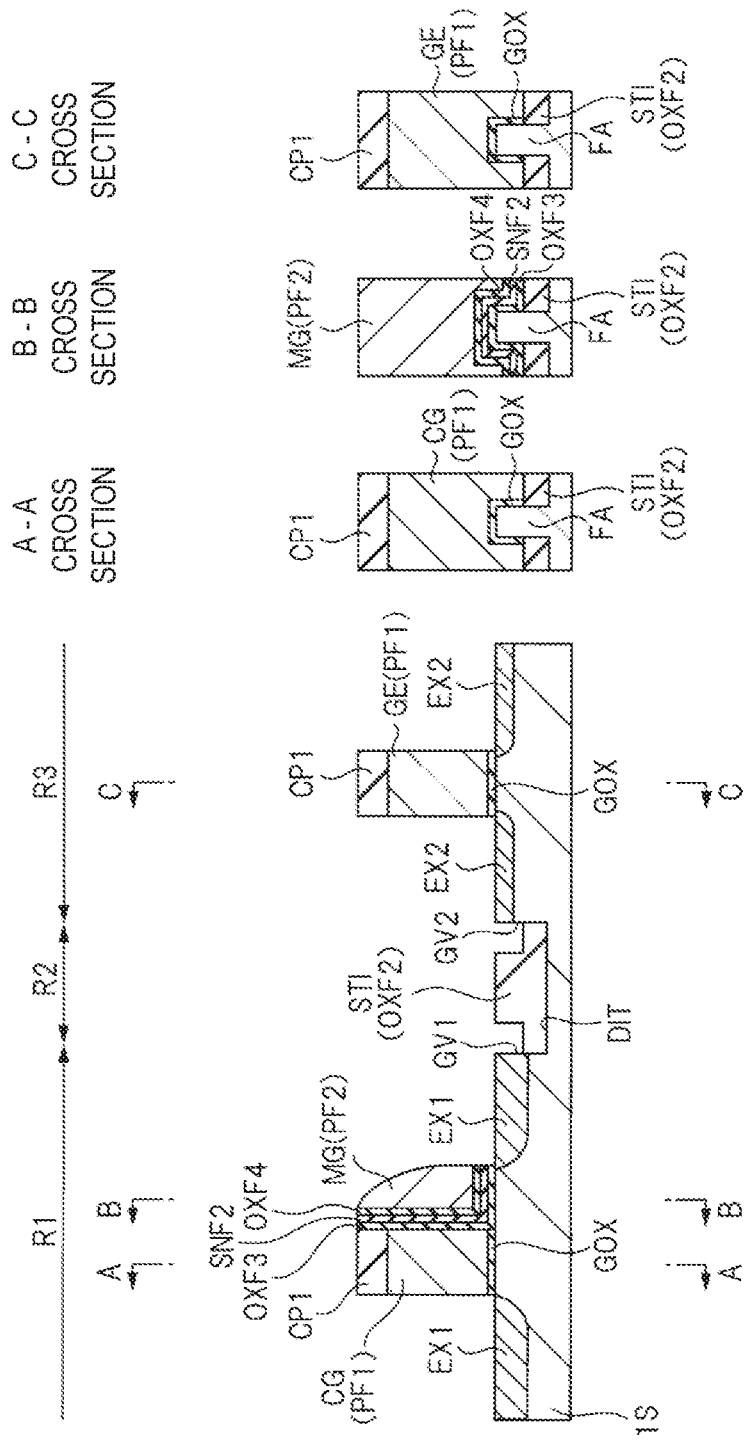
FIG. 42 is a cross-sectional view showing the manufacturing process of the semiconductor device following FIG. 41.

Next, as shown in FIG. 42, the polysilicon film PF2 and the cap film CP1 formed in the peripheral circuit forming region R3 are patterned by using photolithography technique and etching technique. As a result, as shown in FIG. 42, the gate electrode GE formed of the polysilicon film PF1 can be formed in the peripheral circuit forming region R3. Thereafter, extension regions EX2 are formed in the peripheral circuit forming region R3 by using photolithography technique and ion implantation method. The extension regions EX2 are formed in alignment with the gate electrode GE.

Figure 43:
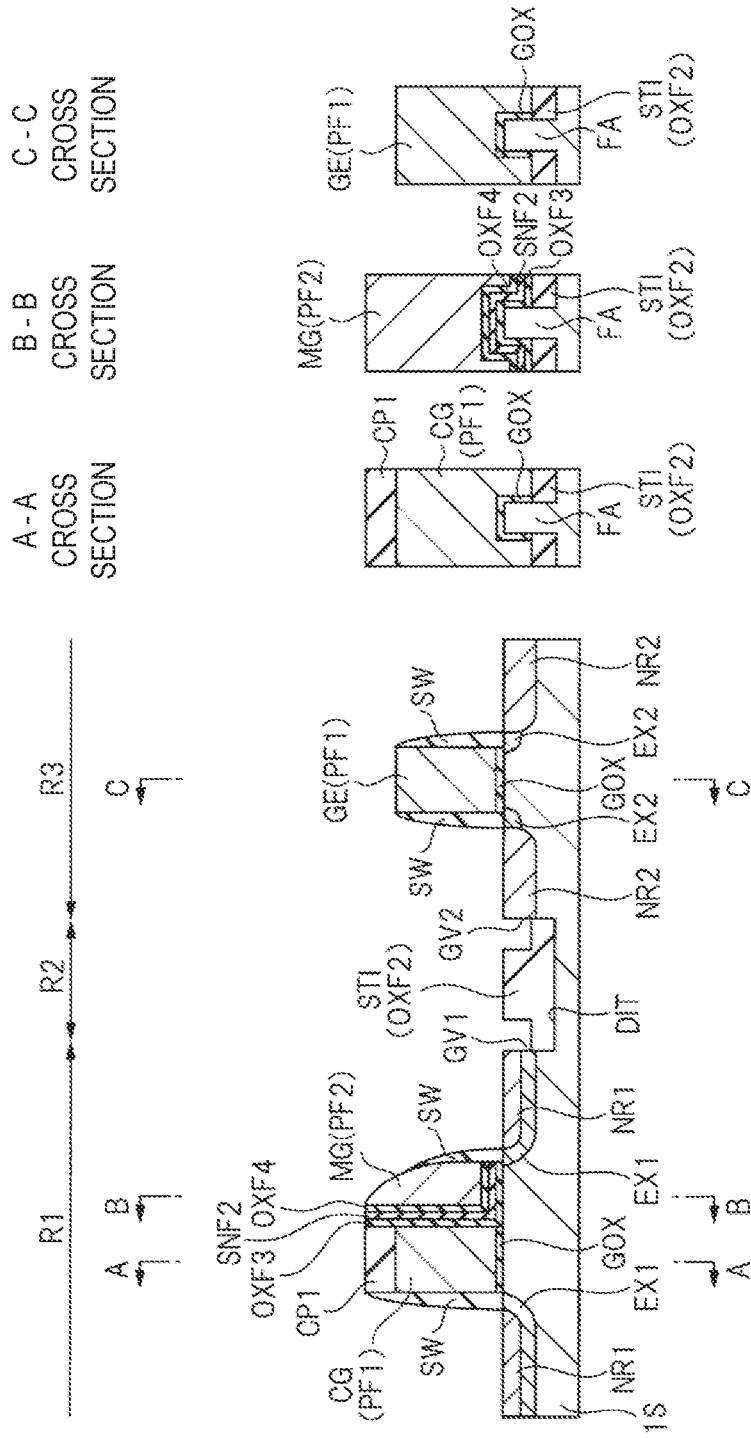
FIG. 43 is a cross-sectional view showing the manufacturing process of the semiconductor device following FIG. 42.

Then, as shown in FIG. 43, after an insulating film formed of, for example, a silicon oxide film is formed over the memory array forming region R1, the boundary region R2, and the peripheral circuit forming region R3, anisotropic etching is performed on the insulating film. Thus, in the memory array forming region R1, the sidewall spacers SW can be formed on the sidewall of the control gate electrode CG and the sidewall of the memory gate electrode MG. Similarly, in the peripheral circuit forming region R3, the sidewall spacers SW can be formed on the sidewalls of the gate electrode GE.

Subsequently, by introducing conductivity type impurities into the fins FA by using photolithography technique and ion implantation method, diffusion regions NR1 are formed in the memory array forming region R1, and diffusion regions NR2 are formed in the peripheral circuit forming region R3. The diffusion regions NR1 and NR2 are formed in alignment with the sidewall spacers SW.

Figure 44:
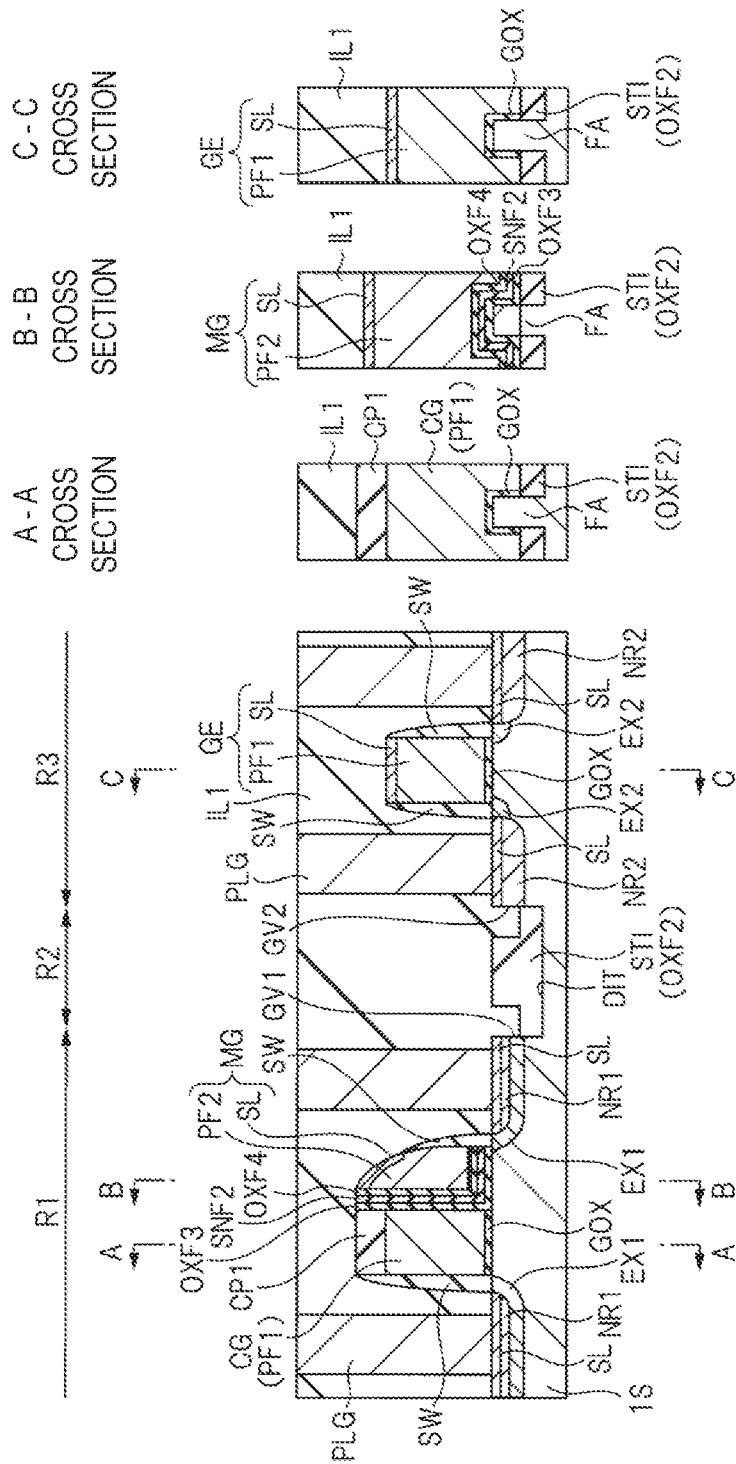
FIG. 44 is a cross-sectional view showing the manufacturing process of the semiconductor device following FIG. 43.

Next, as shown in FIG. 44, silicide films SL are formed on the surfaces of the diffusion regions NR1, the surfaces of the memory gate electrodes MG, the surfaces of the diffusion regions NR2, and the surfaces of the gate electrodes GE. As described above, the memory cell of the "fin-structure" can be formed in the memory array forming region R1, and the field effect transistors of the "fin-structure" can be formed in the peripheral circuit forming region R3.

Thereafter, as shown in FIG. 44, for example, an interlayer insulating film IL1 is formed to cover the memory cell of the "fin-structure" formed in the memory array forming region R1, the element isolation region STI formed in the boundary region R2, and the field effect transistor of the "fin-structure" formed in the peripheral circuit forming region R3. The interlayer insulating film IL1 can be formed of, for example, a silicon oxide film. Then, contact holes penetrating the interlayer insulating film IL1 are formed by using photolithography and etching technique, and then conductive materials are embedded in the contact holes to form plugs PLG. Next, wirings are formed on the interlayer insulating film IL1 in which the plugs PLG are formed, but the explanation thereof is omitted here.

As described above, the semiconductor device of the second embodiment can be manufactured.

Usefulness for Second Embodiment

The device point of suppressing the generation of a step on the element isolation region STI when forming the "fin-structure" is, of course, also useful for the manufacturing process of the field effect transistor of the "fin-structure" in the above-mentioned first embodiment, but is particularly useful when forming the memory cells of the "fin-structure" in the second embodiment. This is because the memory cell of the "fin-structure" in the second embodiment is a so-called "split-gate type memory cell" in which a sidewall-shaped memory gate electrode MG is formed on one sidewall of the control gate electrode CG. That is, in this memory cell, in order to secure the height of the memory gate electrode MG, the height of the control gate electrode CG needs to be increased, which means that the thickness of the polysilicon film PF1 to be the control gate electrode CG needs to be increased. When the thickness of the polysilicon film PF1 is increased, if there is a region in which a step is generated, the thickness of the polysilicon film is particularly increased in that region, and etching residues are easily generated. Therefore, when forming the memory cell of the "fin-structure" in the second embodiment, a device for suppressing the step generated when the memory cell of the "fin-structure" is formed is of particular importance. From this, it can be said that a device for suppressing the generation of steps on the element isolation region STI when the "fin-structure" is formed is particularly useful in the second embodiment.

The invention made by the present inventor has been described above in detail based on the embodiments, but the present invention is not limited to the embodiments described above, and it is needless to say that various modifications can be made without departing from the gist thereof.

What is claimed is:

1. A method for manufacturing a semiconductor device comprising the steps of:
   (a) preparing a semiconductor substrate having a first region in which a plurality of memory cells are to be formed and a second region in which an active transistor is not formed, the second region surrounding the first region in plan view;
   (b) forming a plurality of fins on the semiconductor substrate in the first region, each of the plurality of fins being arranged at a predetermined interval in a first direction and extending in a second direction intersecting with the first direction to provide an element isolation trench in the first region between the plurality of fins and in the second region, a width of the element isolation trench in the second region being larger than a width of the element isolation trench in the first region between the plurality of fins in plan view;
   (c) after the step (b), embedding an insulating film in the element isolation trench such that a thickness of the insulating film in the second region is larger than a thickness of the insulating film in the first region between the plurality of fins;
   (d) after the step (c), forming a first conductive film in the first region and the second region to cover the plurality of fins and the insulating film; and
   (e) after the step (d), patterning the first conductive film by etching to form a first gate electrode of each of the plurality of memory cells.

2. The method according to claim 1,
wherein the step (c) includes the steps of:
(c1) embedding the insulating film in the element isolation trench;
(c2) forming a pattern surrounding the plurality of fins in plan view at a distance from the plurality of fins on the insulating film in the second region; and
(c3) reducing the thickness of the insulating film in the first region by etching using the pattern as a mask, and
wherein in the step (c), the distance between the plurality of fins and the pattern is equal to or less than the predetermined interval.

3. The method according to claim 2, wherein in the step (c), a convex shape is formed on a surface of the insulating film in the second region.

4. The method according to claim 2, wherein a distance between an end portion of each of the plurality of fins in the second direction and the pattern is equal to or more than a distance between the first gate electrodes adjacent to each other.

5. The method according to claim 2,
wherein the first region is a memory array forming region, and
wherein an outer region of the second region is a peripheral circuit forming region.

6. The method according to claim 2,
wherein in the step (c3), an isotropic etching is used, and
wherein in the step (c), a distance between a first fin of the plurality of fins arranged outermost in the first direction and the pattern is smaller than the predetermined interval, and the distance between an end portion of each of the plurality of fins in the second direction and the pattern is smaller than the predetermined interval.

7. The method according to claim 2, wherein the pattern is a resist pattern.

8. The method according to claim 2, further comprising:
(f) forming a stacked insulating film covering the first gate electrode;
(g) forming a second conductive film on the stacked insulating film;
(h) forming sidewall spacers on both sidewalls of the first gate electrode via the stacked insulating film by performing an anisotropic etching to the second conductive film; and
(i) leaving the sidewall spacer formed on one sidewall of the first gate electrode and removing the sidewall spacer formed on the other sidewall of the first gate electrode, thereby forming a second gate electrode formed of the sidewall spacer on one sidewall of the first gate electrode.

9. The method according to claim 8, wherein the step (f) includes the steps of:
(f1) forming a first insulating film covering the first gate electrode;
(f2) forming a charge storage film on the first insulating film; and
(f3) forming a second insulating film on the charge storage film.

10. The method according to claim 9,
wherein the first insulating film is a silicon oxide film,
wherein the charge storage film is a silicon nitride film, and
wherein the second insulating film is a silicon oxide film.

11. The method according to claim 8,
wherein the first conductive film is a polysilicon film, and
wherein the second conductive film is a polysilicon film.

* * * * *